(12) United States Patent
Kato

(10) Patent No.: US 7,863,633 B2
(45) Date of Patent: Jan. 4, 2011

(54) SOLID-STATE IMAGING DEVICE, CAMERA AND SIGNAL PROCESSING METHOD

(75) Inventor: Yoshiaki Kato, Shiga (JP)

(73) Assignee: PANASONIC Corporation, Osaka (JP)

( * ) Notice: Subject to any disclaimer, the term of this patent is extended or adjusted under 35 U.S.C. 154(b) by 635 days.

(21) Appl. No.: 11/697,498

(22) Filed: Apr. 6, 2007

(65) Prior Publication Data

US 2007/0235756 A1    Oct. 11, 2007

(30) Foreign Application Priority Data

Apr. 10, 2006 (JP) .............................. 2006-108035

(51) Int. Cl.
*H04N 1/19* (2006.01)
(52) U.S. Cl. .............................. 257/98; 257/79; 257/88; 257/80; 257/90; 257/440; 257/E27.134; 257/89
(58) Field of Classification Search ................... 257/98, 257/451, 89, E27.134
See application file for complete search history.

(56) References Cited

U.S. PATENT DOCUMENTS

| 2003/0063204 A1 | 4/2003 | Suda |
| 2004/0004668 A1 | 1/2004 | Namazue et al. |
| 2006/0205107 A1* | 9/2006 | Inaba et al. ................... 438/57 |

FOREIGN PATENT DOCUMENTS

| EP | 1341235 | 9/2003 |
| JP | 2000-151933 | 5/2000 |
| WO | WO/2005/069376 | * 7/2005 |

OTHER PUBLICATIONS

English Language Abstract of JP 2000-151933.
U.S. Appl. No. 11/621,276 to Kato, filed Jan. 9, 2007.

* cited by examiner

*Primary Examiner*—Marcos D. Pizarro
*Assistant Examiner*—Eva Yan Montalvo
(74) *Attorney, Agent, or Firm*—Greenblum & Bernstein, P.L.C.

(57) ABSTRACT

The solid-state imaging device of the present invention includes: photodiodes which are two-dimensionally arranged; light condensers each of which condenses light and is provided in a position to correspond to two of the photodiodes which are adjacent to each other; and separating units each of which separates the light entering through the light condensers into first light having a wavelength within a predetermined range, and second light having a wavelength out of the predetermined range, and is provided in a position to correspond to one of the light condensers. Each of the separating units includes: a light-selecting unit which selectively allows transmission of one of the first light and the second light and reflect the other one of the first light and the second light, and allow entering of the transmitted light to one of the corresponding two of the photodiodes; and a light-reflecting unit which reflects the light, reflected by the light-selecting unit, towards the other one of the corresponding two of the photodiodes.

17 Claims, 25 Drawing Sheets

PRIOR ART

PRIOR ART

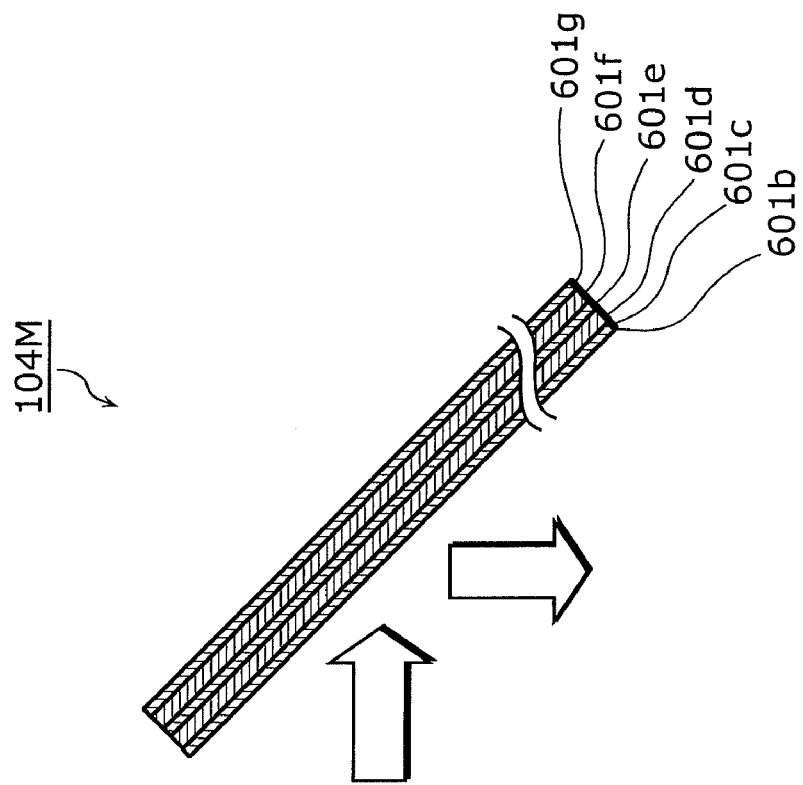
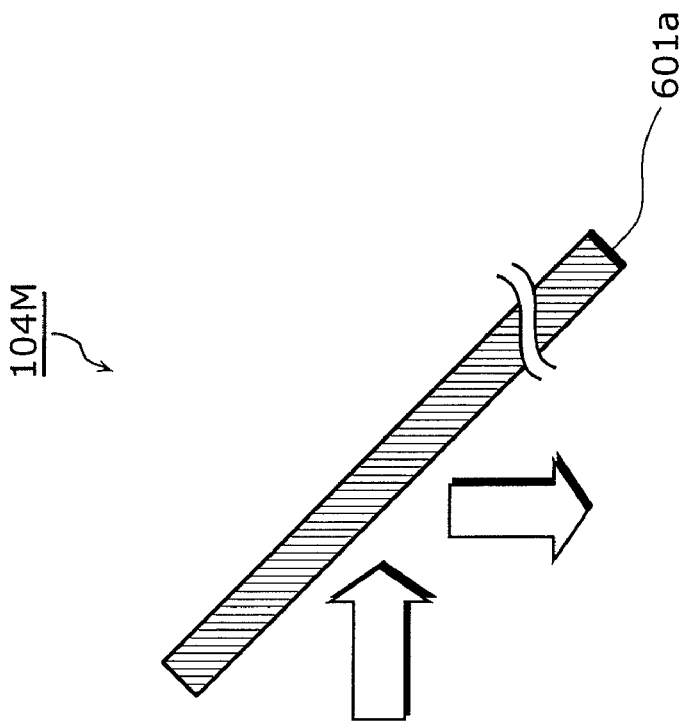

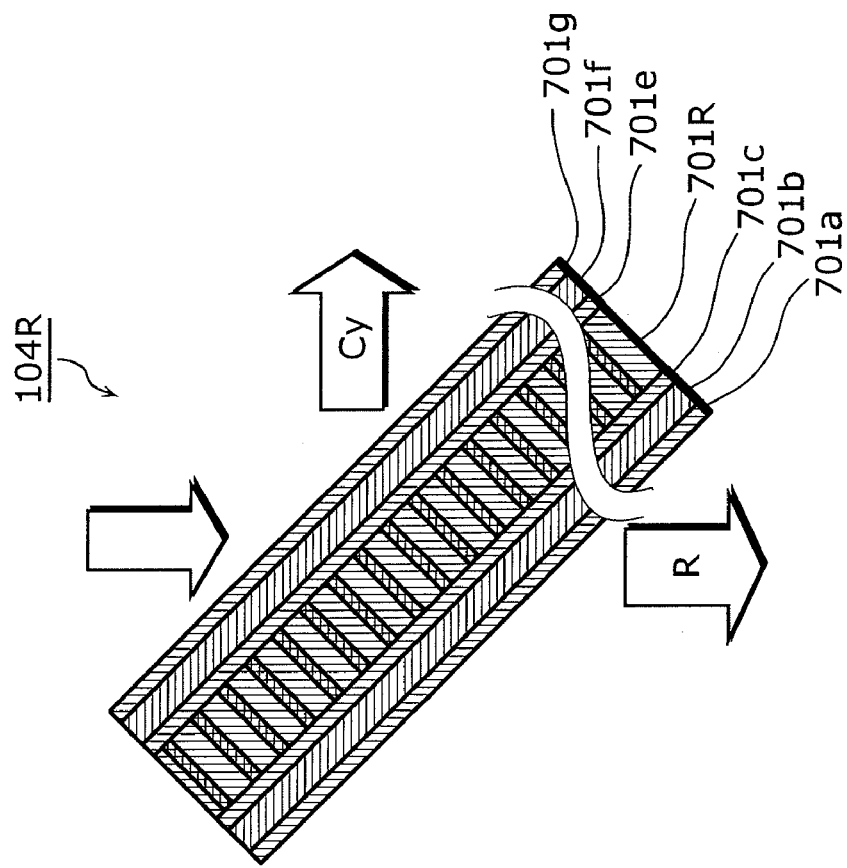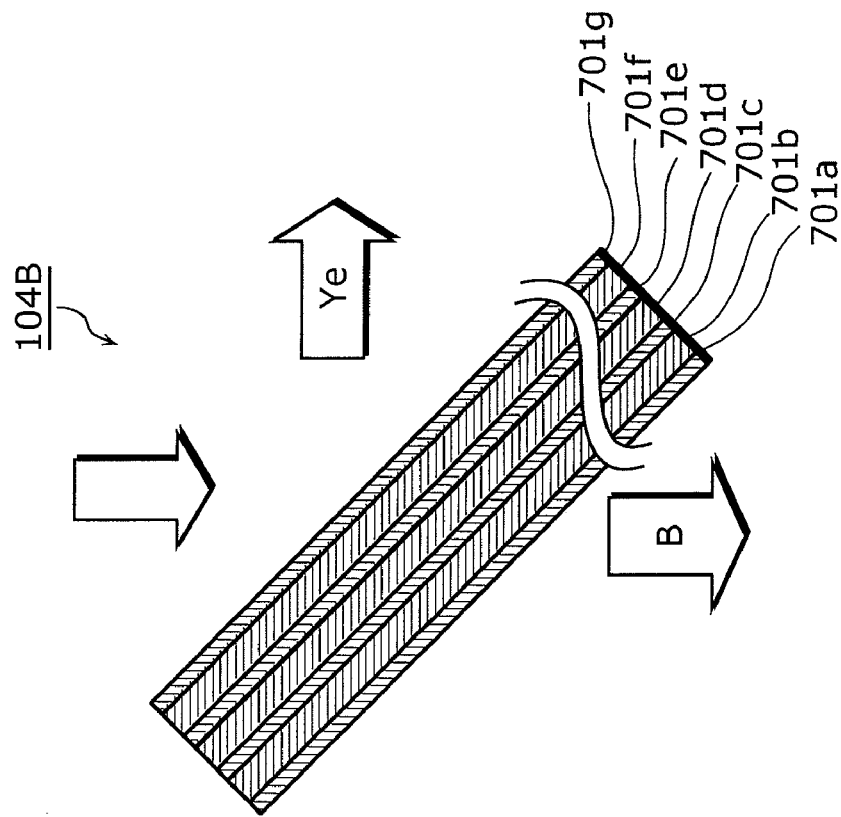

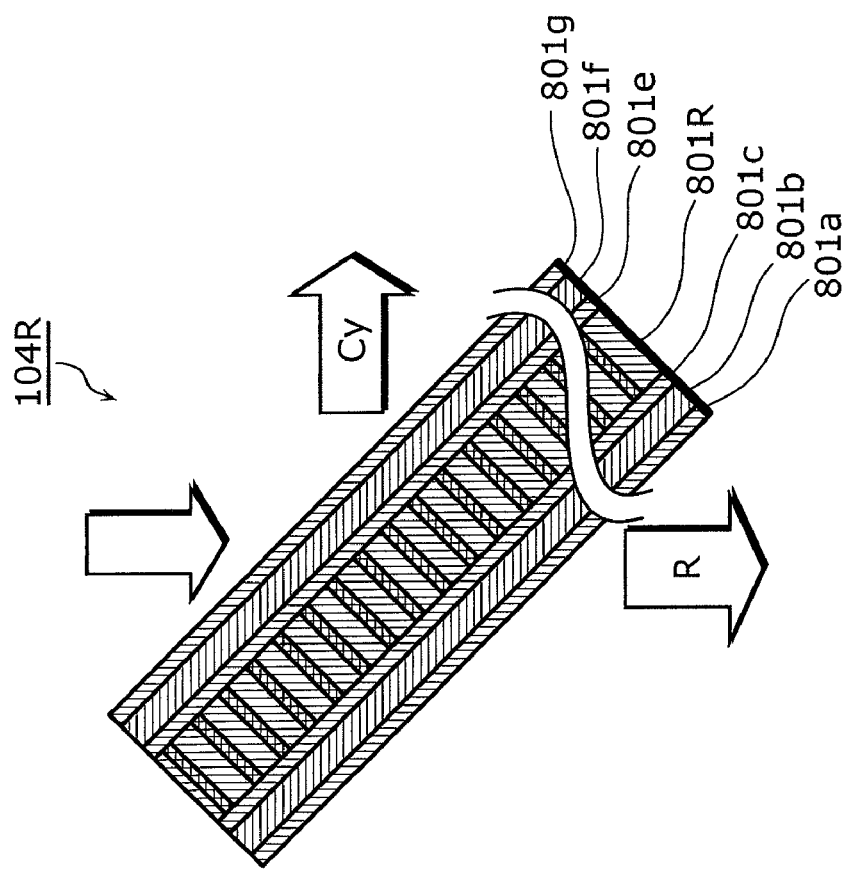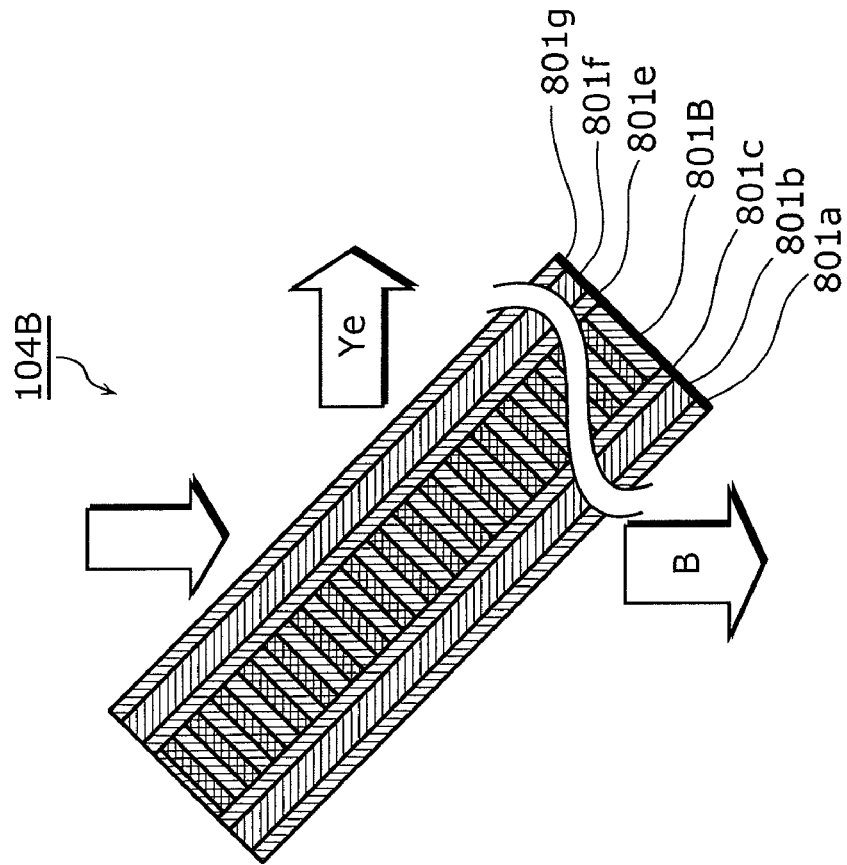

FIG. 12
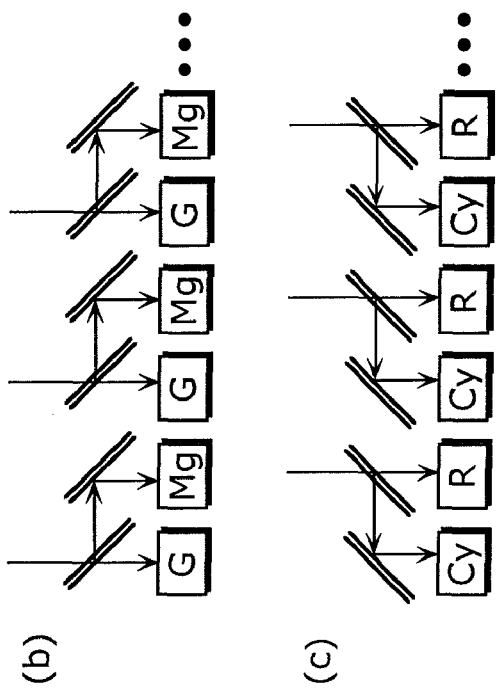
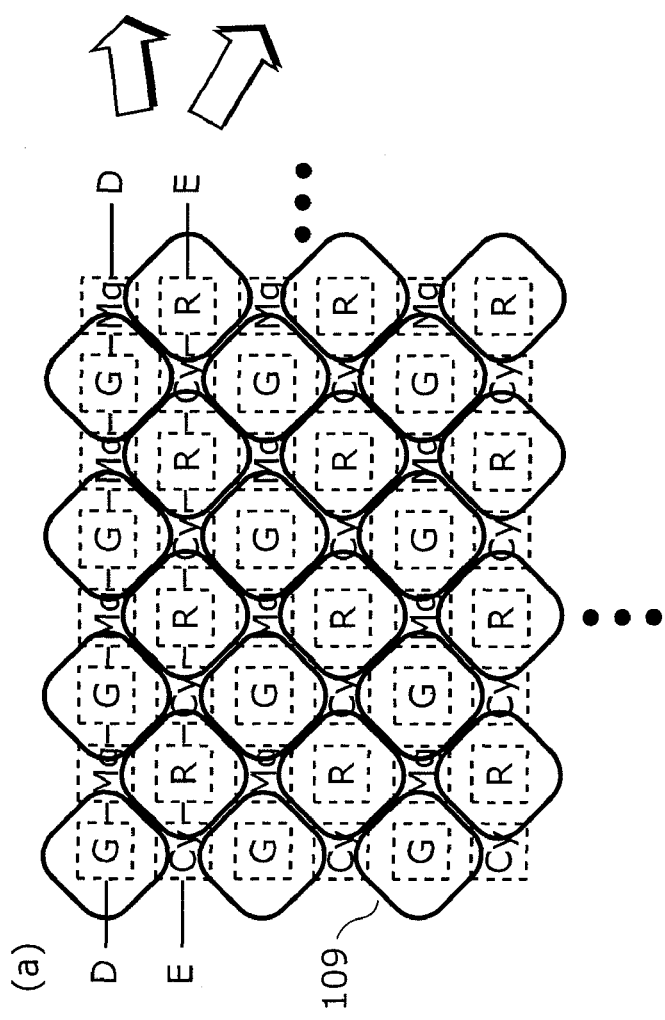

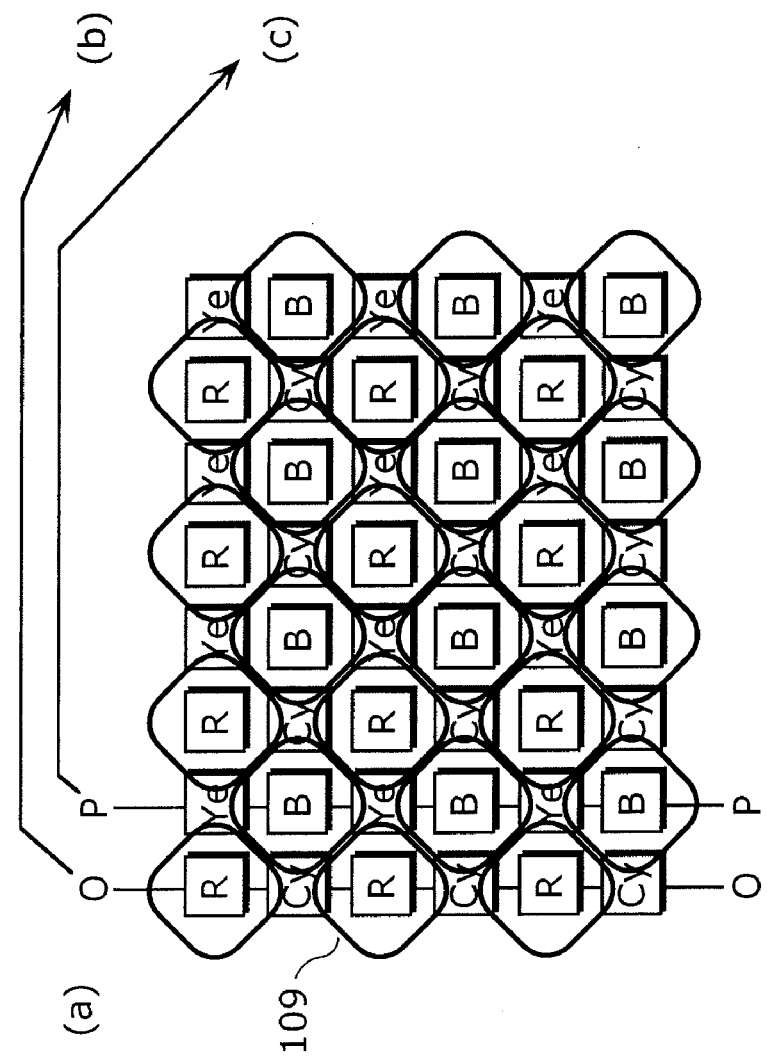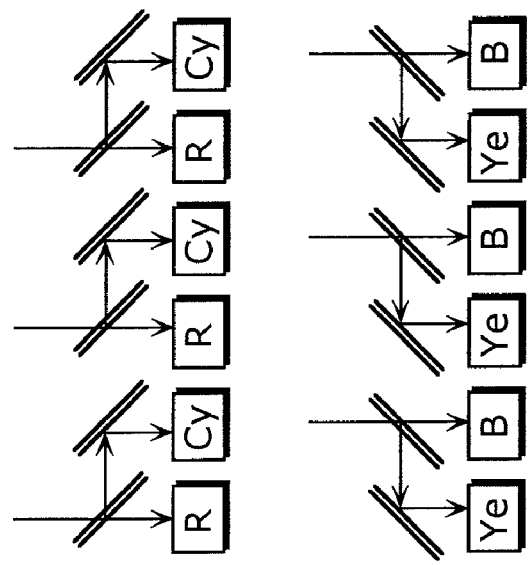
FIG. 24 ns. FIG. 2 is a cross-
SOLID-STATE IMAGING DEVICE, CAMERA AND SIGNAL PROCESSING METHOD

BACKGROUND OF THE INVENTION (1.) Field of the Invention

The present invention relates to a solid-state imaging device and a camera.

(2.) Description of the Related Art

A conventional solid-state imaging device obtains signals of desired colors through color filters in order to obtain pixel signals which correspond to red (R), green (G) and blue (B). Incident light which enters the solid-state imaging device enters photodiodes via microlenses and color filters. An example of an arrangement of is color filters is the Bayer arrangement.

A conventional technology of a solid-state imaging device which enhances sensitivity and improves a color separating characteristic is disclosed in the Japanese Laid-Open Patent Application No. 2000-151933 (Patent Reference 1).

FIG. 1 is a plan view showing an imaging element of the above mentioned conventional technology. FIG. 2 is a cross-section diagram taken along the line A-A' in FIG. 1.

The solid-state imaging device shown in FIG. 2 includes a red photodiode 2, a green photodiode 3, and a blue photodiode 4 which are positioned near a surface of a semiconductor substrate 1. The red photodiode 2, the green photodiode 3, and the blue photodiode 4 are covered by a transparent film 5 which is made of silica glass, for example.

The transparent film 5 is formed in such manner that its top surface, opposite to its lower surface covering the photodiodes 2, 3 and 4, has a mountain range-like shape. A filter 6, a filter 7 and a filter 8 are formed on inclined areas of the top surface of the transparent film 5 having the mountain range-like shape which are inclined by a fixed angle in the same direction. The filters 6, 7 and 8 are arranged in positions which correspond to the photodiodes 2, 3 and 4, respectively.

The inclination angle of each of the filters 6, 7 and 8 is preferred to be as close to 45° as possible so that light which enters the filter 6 from above is reflected towards the right direction of the figure, and is then reflected by the filter 7 or 8 to enter the photodiode 3 or 4, respectively.

The filter 6 has a characteristic that allows transmission of red light R and reflects green light G and blue light B. The filter 7 has a characteristic that allows transmission of blue light B and reflects green light G. The filter 8 has a characteristic that reflects any colors of light.

The filters 6 and 7 generally include a multilayer film which is called dichroic filter, and are structured in the same manner as the filter which is usually formed on a surface of a dichroic prism of a three charge coupled device (3CCD) video camera and an electric still camera. The filter 8 includes a total reflection film which includes a metal film made of aluminum, for example.

The filters 6, 7 and 8 are covered by a transparent film 9 having a refractive index which is low compared to that of the transparent film 5.

On an area of the transparent film 9 that corresponds to the filter 6, there is a concave lens 11. The transparent film 9 is covered by a light-blocking film 35. On an area of the light-blocking film 35 that corresponds to the filter 6, there is an aperture 36. Through the aperture 36 of the light-blocking film 35 and the concave lens 11, light enters the filter 6 only, and unnecessary light does not enter the other filters 7 and 8 as the unnecessary light is blocked by the light-blocking film 35.

The light-blocking film 35 and the concave lens 11 are covered by a transparent film 12. On an area of the transparent film 12 that corresponds to the filter 6, there is a convex lens 13. Accordingly, for a set of one red photodiode 2, one green photodiode 3, and one blue photodiode 4 for three pixels, there is a light condenser which is made up of a pair of one convex lens 13 and one concave lens 11.

Incident light is condensed by the convex lens 13 and the concave lens 11, and enters, as collimated light, the filter 6 which is an initial stage.

Among the incident light which enters the filter 6, red light R enters the red photodiode 2 through the filter 6. Among the incident light which enters the filter 6, green light G and blue light B are reflected by the filter 6 towards the right direction, that is, towards the filter 7.

Green light G and blue light B enter the filter 7. However, green light G is reflected by the surface of the filter 7, and enters the green photodiode 3. Blue light B transmits the filter 7 and enters the filter 8. Then blue light B is reflected by the filter 8 and enters the blue photodiode 4.

As described above, the solid-state imaging device of the conventional technology: separates the incident light into red, green and blue as the filters 6, 7 and 8 reflect and/or allow transmission of the incident light; and allocates the light of each color to the corresponding photodiode 2, 3 or 4. As a result, compared to filters having a structure in which specific light among incident light is thermally converted and the remaining light passes, the percentage of the incident light which reaches the photodiodes increases and thus the sensitivity is enhanced.

However, as pixel cells in solid-state imaging devices of recent years become denser and minituralized, the sensitivity is desired to be further enhanced. For example, in the above described conventional technology, separating primary colors from incident light results in a loss of light when light of each primary color transmits or reflects off. For example, in FIG. 2, blue light B reflects off the filter 6, transmits the filter 7, and reflects off the filter 8, and thus causing a loss of light.

The present invention aims at providing a solid-state imaging device and a camera which can enhance a resolution and sensitivity.

SUMMARY OF THE INVENTION

In order to achieve the above mentioned object, the solid-state imaging device of the present invention includes: photodiodes which are two-dimensionally arranged; light condensers each of which condenses light and is provided in a position to correspond to two of the photodiodes which are adjacent to each other; and separating units each of which separates the light entering through the light condensers into first light having a wavelength within a predetermined range, and second light having a wavelength out of the predetermined range, and is provided in a position to correspond to one of the light condensers. Each of the separating units includes: a light-selecting unit which selectively allows transmission of one of the first light and the second light and reflect the other one of the first light and the second light, and allow entering of the transmitted light to one of the corresponding two of the photodiodes; and a light-reflecting unit which reflects the light, reflected by the light-selecting unit, towards the other one of the corresponding two of the photodiodes. With this structure, since the incident light is separated into two light, and each of the separated two light enters a corresponding photodiode, a loss of light in course of separation is reduced, and thus the sensitivity can be enhanced. More specifically, since one of the first light and the second light enters the corresponding photodiode after transmitting the light-selecting unit once, and the other one of the first light and the second light enters the corresponding photodiode after reflecting off twice of the light-selecting unit and the light-reflecting unit, a loss of light caused by the transmission and the reflection can be reduced compared to the case where the incident light is separated into three light, and therefore the sensitivity can be enhanced. Further, a loss of light can be reduced compared to an absorption color filter which includes a pigment or a dye. Furthermore, since each of the light condensers is provided in a position to correspond to two of the photodiodes, it is possible to condense a larger amount of light to each of the photodiodes.

Here, the light-reflecting unit may reflect only visible light. Further, the solid-state imaging device may further include a removing unit which removes infrared light, and each of the separating units may separate light in which the infrared light is removed by the removing unit into the first light and the second light. With this structure, unnecessary light (for example, infrared light) which is light other than visible light is removed, and thus it is possible to enhance the image quality by enhancing the sensitivity with respect to visible light.

Here, the separating units may include first type separating units and second type separating units. The first light separated by the first type separating units may be first primary color light indicating a first primary color, among red, green and blue, and the second light separated by the first type separating units may be first complementary color light indicating a first complementary color which is a complementary color of the first primary color. The first light separated by the second type separating units may be second primary color light indicating a second primary color which is different from the first primary color, and the second light separated by the second type separating units may be second complementary color light indicating a second complementary color which is a complementary color of the second primary color. Here, the first primary color light, the first complementary color light, the second primary color light, and the second complementary color light may be red light, cyan light, blue light and yellow light, respectively. The first type separating units may be arranged in the same rows or columns, and the second type separating units may be arranged in the same rows or columns. With this structure, since the first primary color, the first complementary color, the second primary color and the second complementary color are used, two combinations of a primary color and a complementary color reduces a loss of light to a minimum. Further, since the first type separating units are arranged in the same rows or columns, and the second type separating units are arranged in the same rows or columns, manufacturing of the separating units can be simplified.

Here, the first primary color light, the first complementary color light, the second primary color light, and the second complementary color light may be red light, cyan light, green light and magenta light, respectively. The first type separating units may be arranged in the same rows or columns, and the second type separating units may be arranged in the same rows or columns. With this structure, in the case where the transmission characteristic (for example, a width at a half value) of the light-selecting unit which corresponds to blue light is inferior to that of the light-selecting unit which corresponds to a different color, the sensitivity can be enhanced.

Here, the solid-state imaging device may further include a converting unit which converts signals respectively indicating the first primary color, the first complementary color, the second primary color, and the second complementary color, obtained from the photodiodes, into a red color signal, a green color signal and a blue color signal. With this structure, since the first primary color, the first complementary color, the second primary color, and the second complementary color are converted into primary color signals, that is, a red signal, a green signal and a blue signal, three primary color signals having an enhanced sensitivity can be obtained.

Here, the light-selecting unit and one of the corresponding two of the photodiodes may be arranged along an optical axis of the light condensed by the corresponding one of the light condensers. Further, the light condensers may be arranged in such manner that the respective centers of the light condensers in a row are shifted from the respective centers of the light condensers in a vertically adjacent row by a distance between the respective centers of two of the photodiodes which are horizontally adjacent. With this structure, shifting the positions of the light condensers allows an enhancement of a spatial resolution to a maximum spatial resolution.

Here, the light-selecting unit may be a multilayer film which includes two types of optical films having different refractive indices. The optical thickness of each of the optical films may be equal to a quarter of a set center wavelength, and the multilayer film may further include an insulator layer having a photonic structure which is structured based on the set center wavelength. With this structure, it is possible to adjust a light transmission characteristic of the multilayer film, as a dichroic filter and a dichroic mirror, which corresponds to the set center wavelength, based on the optical thickness of the insulator layer. As a result, a commonality of forming processes between two types of light-selecting units can be achieved, and the number of manufacturing man-hours can be reduced.

Here, the light-selecting unit may be a multilayer film which includes two types of optical films having different refractive indices. The optical thickness of each of the optical films may be equal to a quarter of a set center wavelength, and the multilayer film may further include an insulator layer having the optical thickness other than the optical thickness equal to a quarter of the set center wavelength. With this structure, it is possible to adjust the light transmission characteristic of the multilayer film, as a dichroic filter and a dichroic mirror, which corresponds to the set center wavelength, based on the optical thickness of the insulator layer. As a result, a commonality of forming processes between two types of light-selecting units can be achieved, and the number of manufacturing man-hours can be reduced.

Furthermore, the camera of the present invention has the same structure as that of the above described solid-state imaging device.

Further, the signal processing method for use in the solid-state imaging device of the present invention is the signal processing method for use in the solid-state imaging device described above. The signal processing method includes: obtaining, from four of the photodiodes, signals respectively indicating the first primary color, the first complementary color, the second primary color, and the second complementary color; and converting the obtained four signals into a red color signal, a green color signal and a blue color signal. With this structure, since the first primary color, the first complementary color, the second primary color and the second complementary color are converted into primary color signals, that is, a red signal, a green signal and a blue signal, it is possible to obtain signals of the three primary colors having an enhanced sensitivity. In addition, in accordance with the arrangement of the light condensers, a resolution in a specific direction (for example, a vertical direction or a horizontal direction) can be made higher than a resolution in another direction.

According to the solid-state imaging device, the camera and the signal processing method of the present invention, it is possible to enhance the sensitivity, and allows simplification in enhancing a resolution due to the suitability for microfabrication. In addition, it is also possible to enhance the resolution in a specific direction.

FURTHER INFORMATION ABOUT TECHNICAL BACKGROUND TO THIS APPLICATION

The disclosure of Japanese Patent Application No. 2006-108035 filed on Apr. 10, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 8A is a cross-section diagram of a light-reflecting unit 104M.

FIG. 8B is a cross-section diagram of a light-reflecting unit 104M.

FIG. 9A is a cross-section diagram of a light-selecting unit for blue light as a first variation of the light-selecting unit.

FIG. 9B is a cross-section diagram of a light-selecting unit for red light as the first variation of the light-selecting unit.

FIG. 10A is a cross-section diagram of a light-selecting unit for blue light as a second variation of the light-selecting unit.

FIG. 10B is a cross-section diagram of a light-selecting unit for red light as the second variation of the light-selecting unit.

FIG. 12 is a pattern diagram showing cross sections of rows which are adjacent to each other.

FIG. 24 is a pattern diagram showing cross sections of rows which are adjacent to each other in the sixth variation.

DESCRIPTION OF THE PREFERRED EMBODIMENT(S)

First Embodiment

A solid-state imaging device according to the present embodiment separates incident light entering through a microlens into first light having a wavelength within a predetermined range, and second light having a wavelength out of the predetermined range. Further, the first light enters a photodiode, and the second light enters a different photodiode. Further, for separating the incident light entering through the microlens, a multilayer film, having an insulator layer (also called a spacer layer) that has a photonic structure which is structured based on the wavelength within the predetermined range, is used. With this, sensitivity of the solid-state imaging device is enhanced.

Figure 1:
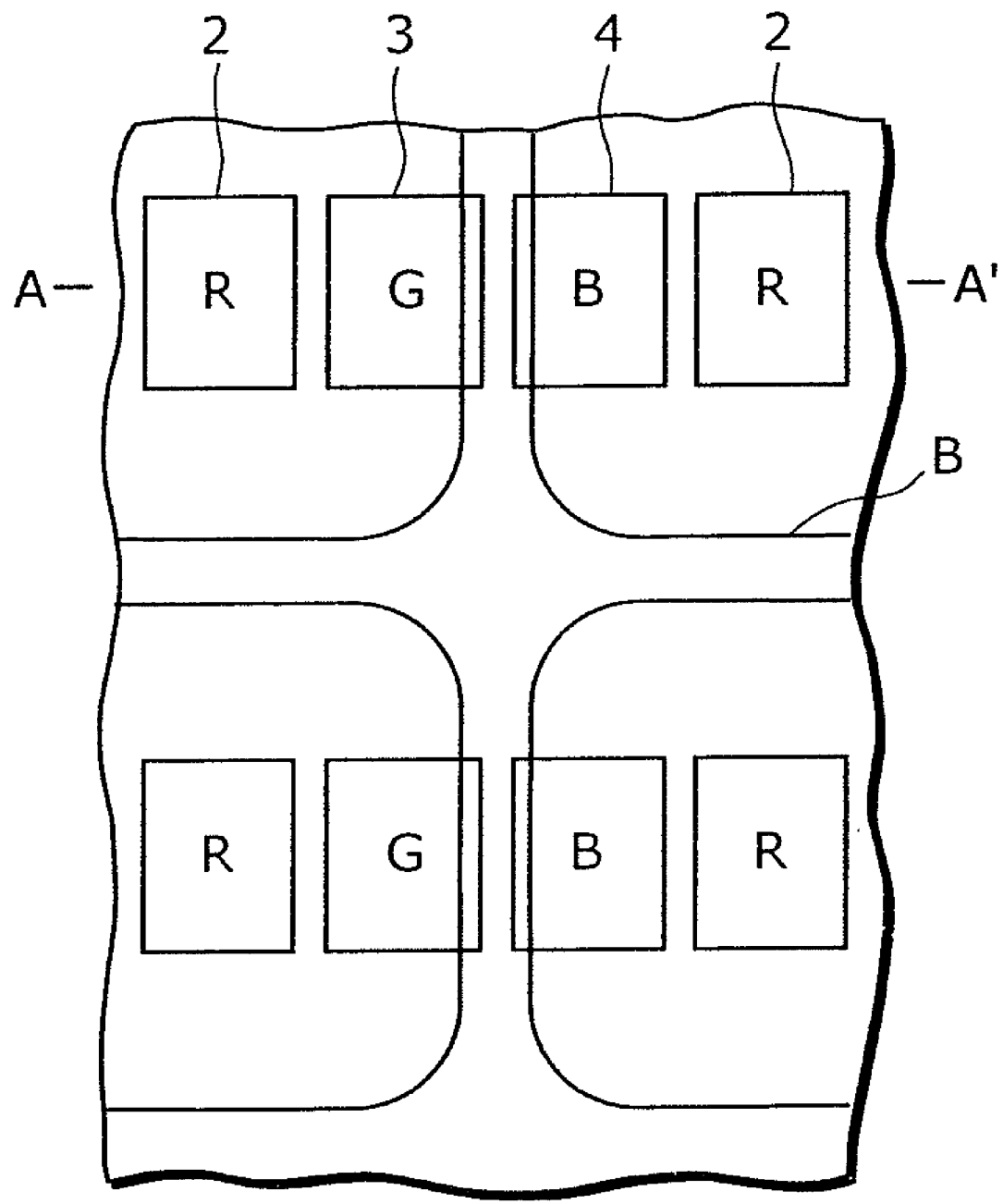
FIG. 1 is a diagram showing an arrangement of photodiodes in a solid-state imaging device of a conventional technology.
Figure 2:
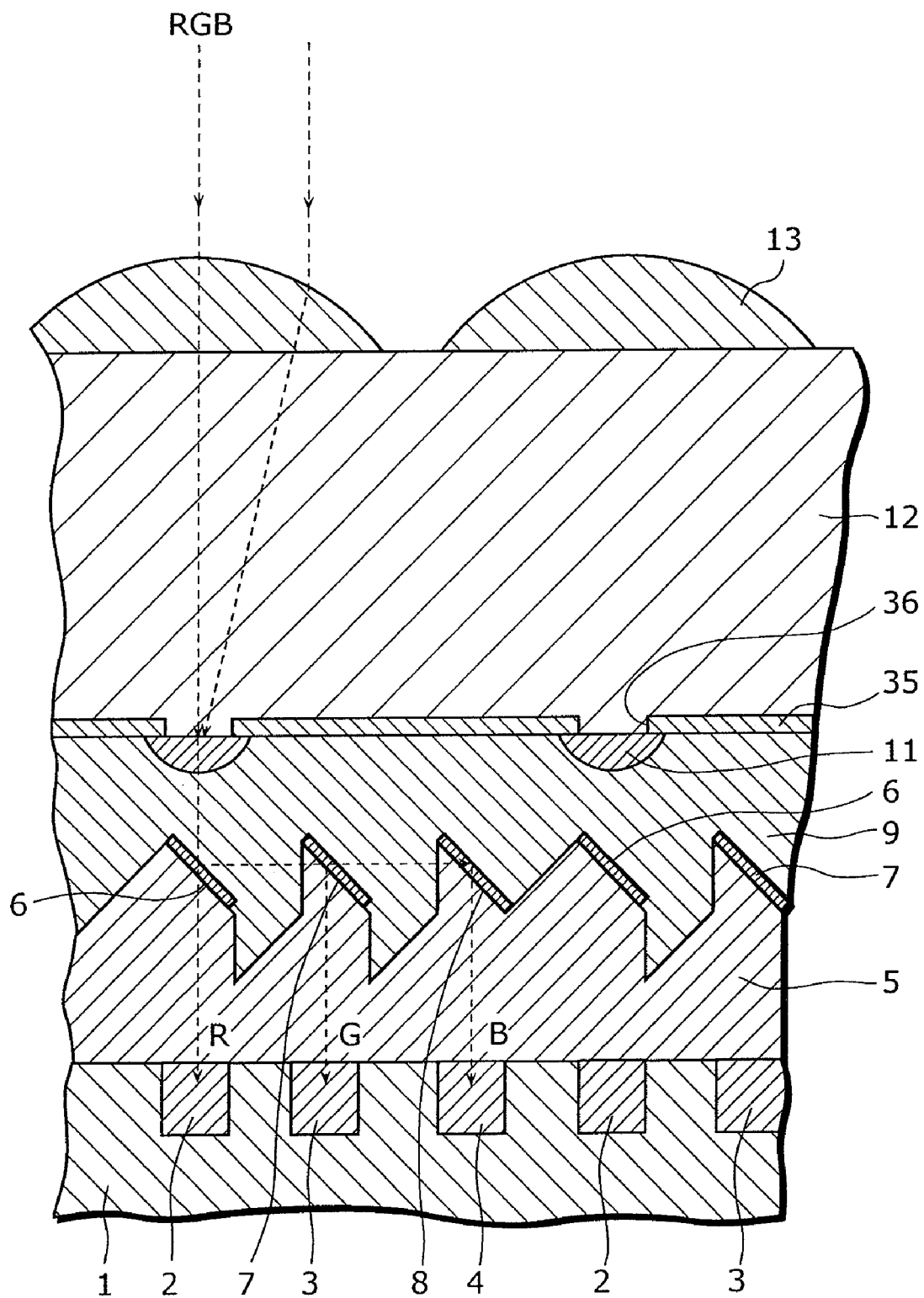
FIG. 2 is a diagram showing a cross section of the solid-state imaging device of the conventional technology.
Figure 3:
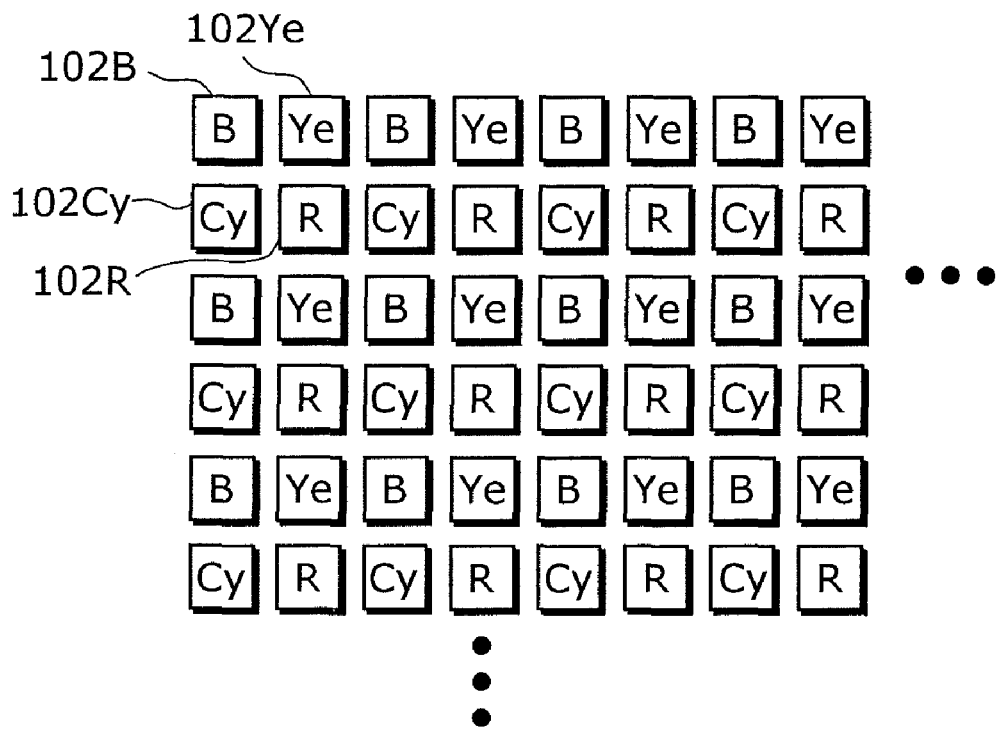
FIG. 3 is a diagram showing a color arrangement of photodiodes in a solid-state imaging device of a first embodiment.

FIG. 3 is a top view showing a color arrangement of photodiodes in the solid-state imaging device of the first embodiment. As this figure shows, the solid-state imaging device includes photodiodes which are two-dimensionally arranged. The above described first light enters one of two photodiodes which are adjacent to each other, and the above described second light enters the other photodiode. There are two types of pairs of two photodiodes which are adjacent to each other. One of the types of pairs is a pair of a photodiode 102B for receiving blue light and a photodiode 102Ye for receiving yellow light, the color of which is a complementary color of blue. Another type of pairs is a pair of a photodiode 102R for receiving red light and a photodiode 102Cy for receiving cyan light, the color of which is a complementary color of red.

As described above, the photodiodes include four types of photodiodes: a photodiode which corresponds to first primary color light indicating a first primary color, that is, one of the colors, red, green and blue; a photodiode which corresponds to first complementary color light indicating a first complementary color, that is, a complementary color of the first primary color; a photodiode which corresponds to second primary color light indicating a second primary color which is different from the first primary color; and a photodiode which corresponds to second complementary color light indicating a second primary color, that is, a complementary color of the second primary color.

Figure 4:
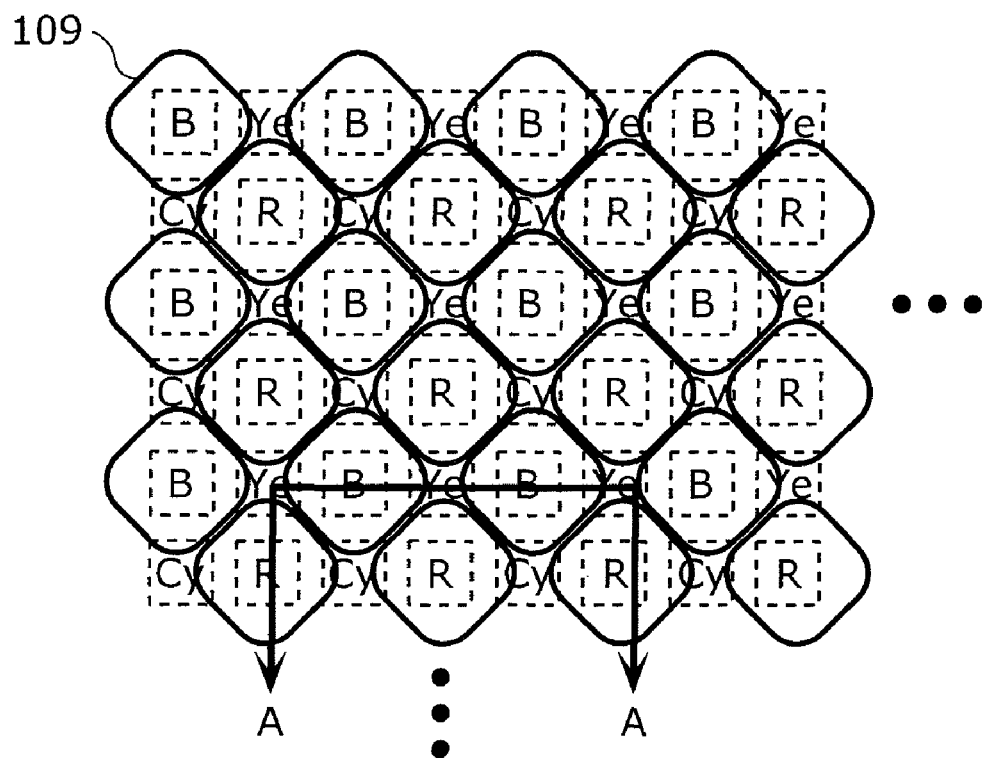
FIG. 4 is a diagram showing an arrangement of microlenses in the solid-state imaging device.

FIG. 4 is a top view showing an arrangement of microlenses in the solid-state imaging device. As the figure shows, each of a plurality of microlenses 109 is provided to correspond to a pair of photodiodes, and serves as a light condenser which condenses light. Although the shape of each of the microlenses 109 is a rounded rhombic shape (a rounded square) as shown in the figure, the shape may be a circle or a square. The optical axis of each of the microlenses 109 is arranged in such way that it matches the center of a photodiode corresponding to a primary color, that is, a photodiode 102B and 102R. More specifically, the microlenses 109 are arranged in such manner that the respective centers of the microlense 109 in a row are shifted from the respective centers of the microlenses 109 in a vertically adjacent row by a distance between the respective centers of two of the photodiodes which are horizontally adjacent.

Figure 5:
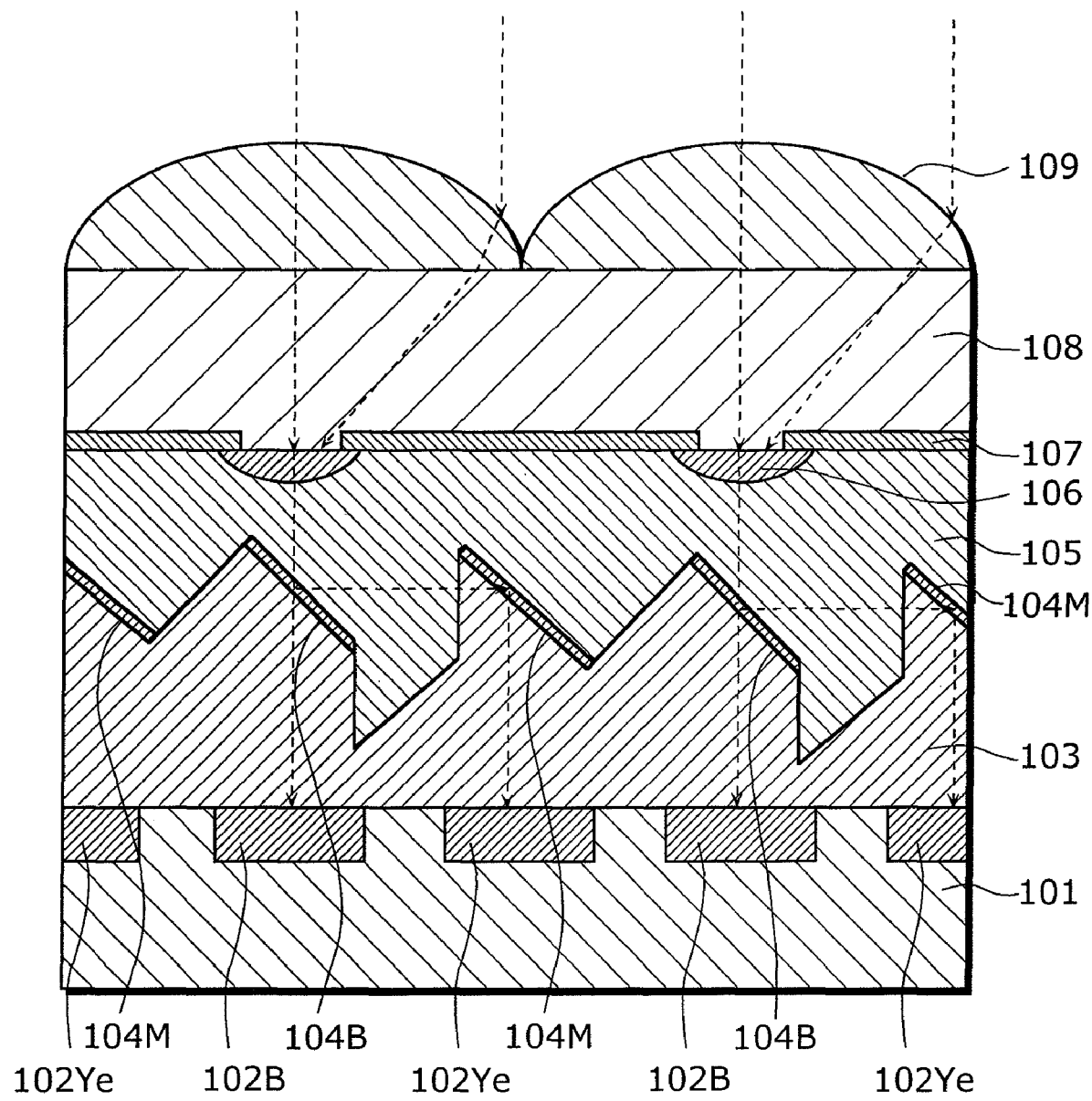
FIG. 5 is a diagram showing a cross section of the solid-state imaging device.

FIG. 5 is a diagram showing a cross section of the solid-state imaging device taken along the line A-A shown in FIG. 4. In this figure, the solid-state imaging device includes the photodiode 102B and the photodiode 102Ye which are positioned near a surface of a semiconductor substrate 101. The photodiode 102B and the photodiode 102Ye are covered by a transparent film 103 which is made of a silica glass, for example.

The transparent film 103 is formed in such manner that its top surface, opposite to its lower surface covering the photodiodes 102B and 104Ye, has a mountain range-like shape. A light-selecting unit 104B and a light-reflecting unit 104M are formed on inclined areas of the mountain range-like shaped top surface which are inclined by a fixed angle in the same direction. The light-selecting unit 104B and the light-reflecting unit 104M are positioned to correspond to the photodiode 102B and the photodiode 102Ye, respectively.

The light-selecting unit 104B has a characteristic that selectively: allows transmission of light which has a wavelength of blue light as the light having a wavelength within the predetermined range, among the incident light entering through the corresponding microlens 109; and reflects yellow light, the color of which is a complementary color of blue (that is, light having a wavelength which differs from the wavelength of blue light). The light-selecting unit 104B is inclined so that the transmitted blue light enters the photodiode 102B and that the reflected yellow light enters the light-reflecting unit 104M which is positioned above the photodiode 102Ye. The inclination angle of the light-selecting unit 104B is preferred to be as close to 45° as possible so that the incident light from above is reflected towards the right direction of the figure, and is further reflected by the light-reflecting unit 104M to enter the photodiode 102Ye.

Furthermore, the light-selecting unit 104R has a characteristic that selectively: allows transmission of light which has a wavelength of red light, among the incident light entering through the corresponding microlens 109; and reflects cyan light, the color of which is a complementary color of red (that is, light having a wavelength which differs from the wavelength of red light). The light-selecting unit 104R is inclined so that the transmitted red light enters the photodiode 102R and that the reflected cyan light enters light-reflecting unit 104M which is positioned above the photodiode 102Cy.

As described above, whether incident light which enters the light-selecting unit 104B transmits or reflects off the light-selecting unit 104B, and whether incident light which enters the light-selecting unit 104R transmits or reflects off the light-selecting unit 104R are determined by the wavelength of the incident light. The wavelength range can be set selectively. Generally, for the light-selecting unit 104B, a multilayer film called dichroic filter can be used, the dichroic filter being structured in the same manner as the filter formed on a surface of a dichroic prism in an electric still camera, a 3CCD video camera, and the like. However, for the light-selecting unit 104B in the present embodiment, a multilayer film including an insulator layer is used, the insulator layer having the photonic structure and being an improved version of the dichroic filter.

The light-reflecting unit 104M has a characteristic which reflects incident light, and includes a total reflection film which includes a metal film made of aluminum, for example.

The light-selecting unit 104B and the light-reflecting unit 104M are covered by a transparent film 105 having a refractive index which is low compared to that of the transparent film 103.

On an area of the transparent film 105 that corresponds to the light-selecting unit 104B, there is a concave lens 106. The transparent film 105 is covered by a light-blocking film 107. On an area of the light-blocking film 107 that corresponds to the light-selecting unit 104B, there is an aperture. Through the aperture and the concave lens 106, light enters the light-selecting unit 104B, and unnecessary light does not enter the light-selecting unit 104R and the light-reflecting units 104M which are adjacent to the light-selecting unit 104B, since the unnecessary light is blocked by the light-blocking film 107.

The light-blocking film 107 and the concave lens 106 are covered by a transparent film 108. On an area of the transparent film 108 that corresponds to the photodiode 102B, the microlens 109 (a convex lens) is provided. Accordingly, for each pair of one photodiode 102B and one photodiode 102Ye which are adjacent to each other, there is a light condenser made up of a pair of one microlens 109 and one concave lens 106.

Incident light is condensed by the microlens 109 and the concave lens 106, and enters the light-selecting unit 104B as collimated light.

Among the incident light which enters the light-selecting unit 104B, blue light B transmits the light-selecting unit 104B and enters the blue photodiode 102B. Among the incident light which enters the light-selecting unit 104B, yellow light Ye, the color of which is a complementary color of blue, is reflected by the light-selecting unit 104B towards the light-reflecting unit 104M which is positioned above the photodiode 102Ye.

Yellow light Ye reflects off the light-reflecting unit 104M, and enters the photodiode 102Ye.

As described above, the light entering through the microlens 109 is separated into blue light and yellow light as the light-selecting unit 104B and the light-reflecting unit 104M reflect and/or allow transmission of the incident light. Further, blue light and yellow light are allocated to the corresponding photodiode 102B or 102Ye. Blue light enters the photodiode 102B after transmitting the light-selecting unit 104B once. Yellow light enters the photodiode 102Ye after reflecting off twice of the light-selecting unit 104B and the light-reflecting unit 104M. Compared to the conventional case where the light is separated into three light, a loss of light resulted from transmission and reflection is reduced, and thus it is possible to enhance the sensitivity. For every pair of two photodiodes, one microlens is provided, therefore a resolution with respect to incident light becomes a half of the number of the photodiodes. However, when the microlenses are arranged in 45° diagonal lines as shown in FIG. 4, the distance between the respective centers of two of the microlenses which are vertically or horizontally adjacent to each other becomes 1.4 times longer than the distance between the respective centers of two of the photodiodes which are vertically or horizontally adjacent to each other. Further, the vertical resolution and the horizontal resolution can be controlled to be 1/1.4 of the number of the photodiodes.

Figure 6:
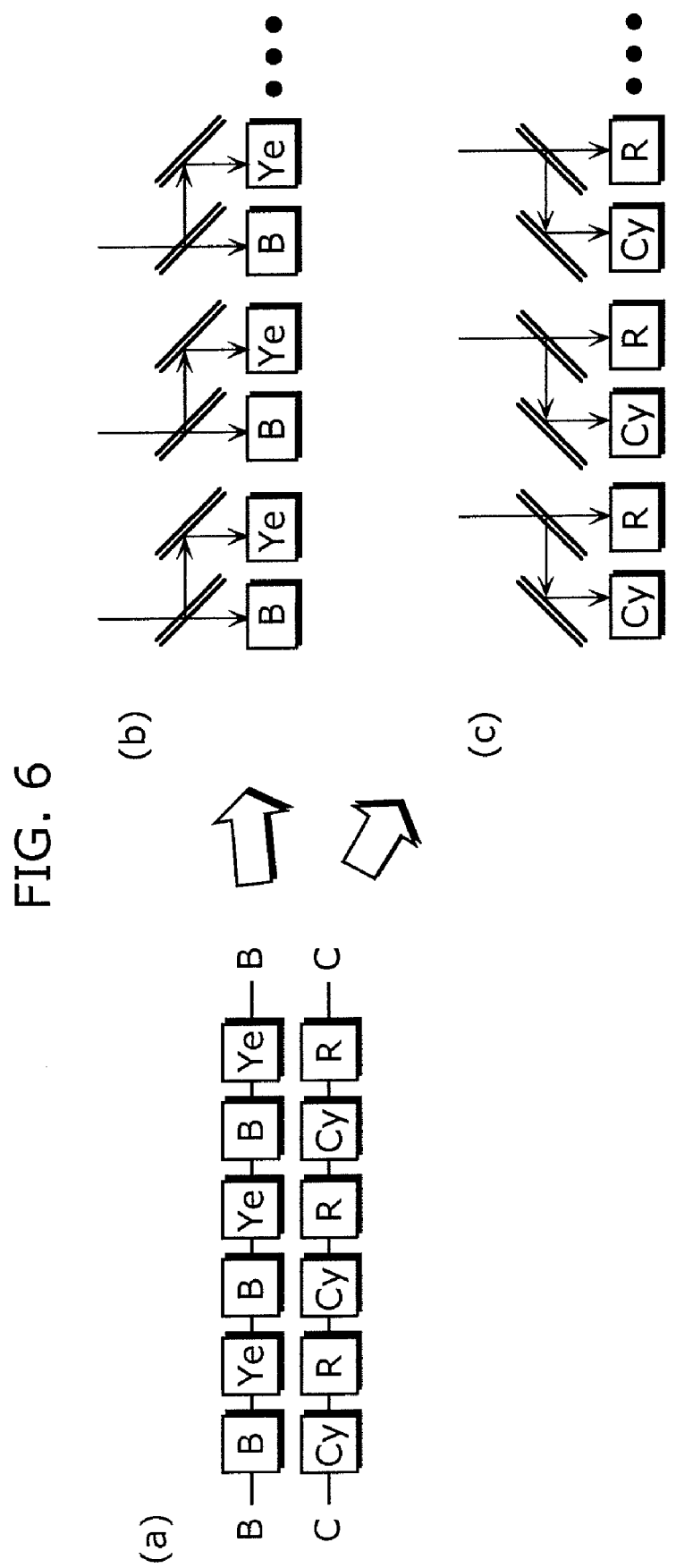
FIG. 6 is a pattern diagram showing cross sections of rows which are adjacent to each other.

FIG. 6 is a pattern diagram showing directions of the light-selecting units and the light-reflecting units in rows adjacent to each other. A section (a) of the figure is a top view showing two rows which are adjacent to each other. In one of the rows, the blue photodiodes 102B and the yellow photodiodes 102Ye are alternately aligned. In the other row of the adjacent rows, the cyan photodiodes 102Cy and the red photodiodes 102R are alternately aligned. A section (b) of FIG. 6 is a pattern diagram showing a cross section taken along the line B-B. In the row shown in the section (b) of the figure in which the photodiodes 102B and the photodiodes 102Ye (hereinafter referred to as B and Ye, respectively) are alternately aligned, a reflecting surface of the light-selecting unit 104B that selectively reflects yellow light having the wavelength different from the wavelength of blue light, faces the right direction of the figure, and a reflecting surface of the light-reflecting unit 104M faces the left direction of the figure. The reflecting surface of the light-selecting unit 104B and the reflecting surface of the light-reflecting unit 104M face each other and both incline in the same direction (45° downward to the right in the figure).

A section (c) of FIG. 6 is a pattern diagram showing a cross section taken along the line C-C. In the section (c) of the figure, the light-reflecting unit 104M and the light-selecting unit 104R are aligned in the opposite manner to the one shown in the section (b). Therefore, a reflecting surface of the light-reflecting unit 104M and a reflecting surface of the light-selecting unit 104R face and incline in the opposite directions to the ones shown in the section (b).

Figure 7B:
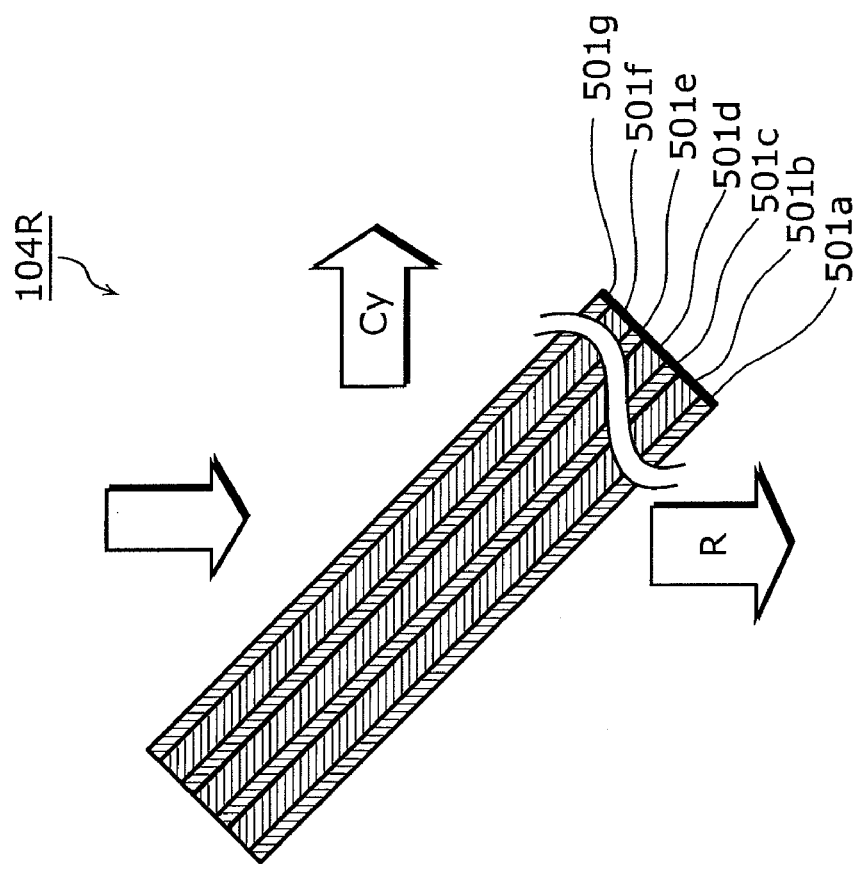
FIG. 7B is a cross-section diagram of a light-selecting unit for red light.
Figure 7A:
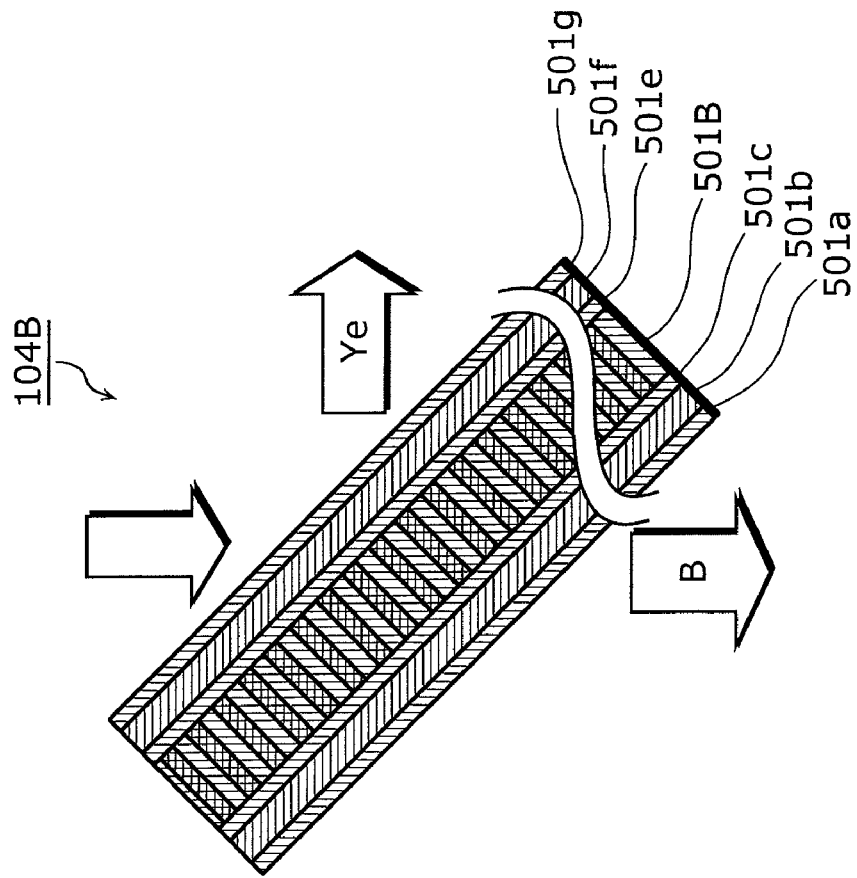
FIG. 7A is a cross-section diagram of a light-selecting unit for blue light.

FIG. 7A and FIG. 7B are cross-section diagrams showing more detailed structures of the light-selecting unit 104B and the light-selecting unit 104R, respectively. As FIG. 7A shows, the light-selecting unit 104B is a multilayer film including a titanium dioxide layer 501a, a silicon dioxide layer 501b, a titanium dioxide layer 501c, an insulator layer 501B, a titanium dioxide layer 501e, a silicon dioxide layer 501f, and a titanium dioxide layer 501g.

More specifically, the light-selecting unit 104B is a dielectric multilayer film in which materials such as a silicon oxide layer ($SiO_2$) having a low refractive index and materials such as a titanium oxide layer ($TiO_2$) and a silicon nitride layer ($Si_3N_4$) having a high refractive index are alternately layered, and in which the insulator layer 501B is also included. All layers except for the insulator layer 501B have the same optical thicknesses. The term "optical thickness" refers to a value nd which is a refractive index n of the material of the layer multiplied by the thickness d of the layer. The optical thicknesses of all layers 501a to 501g, except for the insulator layer 501B, are a quarter of a wavelength $\lambda$ ($\lambda/4$) ($\lambda$ is the wavelength of red light in FIGS. 7A and 7B). The wavelength $\lambda$ which is set for each layer having the optical thickness of $\lambda/4$ is called a set center wavelength.

In contrast, as shown in FIG. 7B, the light-selecting unit 104R is different from the light-selecting unit 104B in that the light-selecting unit 104R includes a silicon dioxide layer 501d having the optical thickness of $\lambda/4$, instead of the insulator layer 501B. The light-selecting unit 104R does not include the insulator layer 501B, and is structured in the same way as the dichroic filter in which each layer has the optical thickness of $\lambda/4$. Therefore, the light-selecting unit 104R selectively allows transmission of light having a wavelength which is equal to the set center wavelength $\lambda$ (red light in this case), and reflects light having a different wavelength. Consequently, the light-selecting unit 104R shown in FIG. 7B serves as a dichroic filter and a dichroic mirror which allow transmission of red light and reflect cyan light, the color of which is a complementary color of red. Note that transmission characteristics of the light-selecting unit 104B and the light-selecting unit 104R are shown in the lower part of FIG. 15A which is described later.

The structure of the insulator layer 501B shown in FIG. 7A has the photonic structure in which titanium dioxide and silicon dioxide are alternately aligned along the principal surface. The insulator layer 501B has a characteristic which allows transmission of light having a wavelength other than $\lambda$ of the above $\lambda/4$. That the light-selecting unit 104B includes the insulator layer 501B is one of the features of the present embodiment. More specifically, based on the optical thickness of the insulator layer 501B, a wavelength range of light which transmits the light-selecting unit 104B can be adjusted. In other words, by including the insulator layer 501B, the light-selecting unit 104B shown in FIG. 7A shifts the transmission wavelength of the dichroic filter in which each layer has the optical thickness of $\lambda/4$, $\lambda$ being the wavelength of red light. Thus, the light-selecting unit 104B is capable of selectively allowing transmission of light within a desired wavelength range (that is, blue light), and reflecting yellow light, the color of which is a complementary color of blue.

As shown in FIG. 7B, the light-selecting unit 104R may be a dichroic filter. As shown in FIG. 7A, the light-selecting unit 104B includes the dielectric multilayer film which is included in the light-selecting unit 104R, and the insulator layer inserted in the dielectric multilayer film. Based on the optical thickness of the insulator layer, the wavelength of light which transmits the light-selecting unit 104B is adjusted to the wavelength of blue light. As a result, the light-selecting unit 104B and the light-selecting unit 104R both include the layers 501a, 501b, 501c, 501e, 501f, and 501g, and therefore, a commonality of manufacturing processes between the light-selecting unit 104B and the light-selecting unit 104R can be achieved, and the number of manufacturing man-hours can be reduced.

Note that the International Patent Publication WO 2005/069376 A1 discloses a technique of adjusting the transmission wavelength in such manner that the transmission wavelength is shifted from the set center wavelength, by providing an insulator layer in a dielectric multilayer film in which each layer has the optical thickness of $\lambda/4$. The light-selecting units 104B and 104R can be manufactured based on this publication.

FIGS. 8A and 8B are cross-section diagrams of the light-reflecting units 104M. The light-reflecting unit 104M shown in FIG. 8A includes an aluminium layer 601a. By including the aluminium layer 601a, the light-reflecting unit 104M completely reflects the incident light entering from the light-selecting unit 104B or the light-selecting unit 104R towards the photodiode 102Ye or the photodiode 102Cy, respectively. The light-reflecting unit 104M shown in FIG. 8B completely reflects visible light only, and serves as a removing unit which removes ultraviolet light and infrared light. Therefore, the light-reflecting unit 104M shown in FIG. 8B is formed by a component such as a multilayer film having layers 601b-601g which absorbs ultraviolet light and infrared light.

As described above, the solid-state imaging device of the present invention is structured in such way that it separates incident light entering through the microlens 109 into the first primary color light having the wavelength within the predetermined range, and the first complementary color light having a wavelength out of the predetermined range. The first primary color light enters one of the photodiodes, and the first complementary color light enters another one of the photodiode. Further, for separating the incident light entering through the microlens 109, the light-selecting units 104B and 104R are used, the light-selecting units 104B and 104R including the multilayer film having the insulator layer that has the photonic structure which is structured based on the wavelength of the predetermined range. Accordingly, sensitivity of the solid-state imaging device can be enhanced, and a commonality of the manufacturing processes can be achieved, and thus the manufacturing cost can be reduced.

Next, a number of variations are described.

FIG. 9A and FIG. 9B are diagrams showing cross-sections of the light-selecting unit 104B and the light-selecting unit 104R as a first variation of the light-selecting units 104B and 104R. The light-selecting unit 104B shown in FIG. 9A is a dichroic filter structured by a multilayer film which includes a titanium dioxide layer 701a, a silicon dioxide layer 701b, a titanium dioxide layer 701c, a silicon dioxide layer 701d, a titanium dioxide layer 701e, a silicon dioxide layer 701f, and a titanium dioxide layer 701g. The set center wavelength of the light-selecting unit 104B is the wavelength of blue light. The light-selecting unit 104R shown in FIG. 9B is different from the light-selecting unit 104B shown in FIG. 9A in that there is an insulator layer 701R having the photonic structure instead of the silicon dioxide layer 701d. Based on the optical thickness of the insulator layer 701R, the transmission wavelength of the light-selecting unit 104R is adjusted to the wavelength of red light. With these structures of the light-selecting unit 104B and the light-selecting unit 104R, too, the common layers 701a, 701b, 701c, 701e, 701f and 701g in the light-selecting unit 104B and in the light-selecting unit 104R share the same optical thicknesses, and thus these common layers can be manufactured at the same time for both types of the light-selecting units. Consequently, a commonality of the manufacturing processes is achieved, and thus the manufacturing cost can be reduced.

FIG. 10A and FIG. 10B are diagrams showing cross-sections of the light-selecting unit 104B and the light-selecting unit 104R as a second variation of the light-selecting units 104B and 104R. The light-selecting unit 104B shown in FIG. 10A is a multilayer film which includes a titanium dioxide layer 801a, a silicon dioxide layer 801b, a titanium dioxide layer 801c, an insulator layer 801B, a titanium dioxide layer 801e, a silicon dioxide layer 801f, and a titanium dioxide layer 801g. The set center wavelength of all layers except for the insulator layer 801B, that is, the set center wavelength of the layers 801a, 801b, 801c, 801e, 801f and 801g, is, for example, the wavelength of green light rather than the wavelength of blue light or red light (the optical thickness of λ/4, λ being the wavelength of green light). The light-selecting unit 104R shown in FIG. 10B is different from the light-selecting unit 104B shown in FIG. 10A in that there is an insulator layer 801R instead of the insulator layer 801B. The insulator layer 801B has the optical thickness which shifts the wavelength of light that transmits the light-selecting unit 104B from the wavelength of green light to the wavelength of blue light, and the wavelength of light that transmits the light-selecting unit 104B is adjusted to the wavelength of blue light. The insulator layer 801R has the optical thickness which shifts the wavelength of light that transmits the light-selecting unit 104R from the wavelength of green light to the wavelength of red light, and the wavelength of light that transmits the light-selecting unit 104R is adjusted to the wavelength of red light.

With these structures of the light-selecting unit 104B and the light-selecting unit 104R, too, the common layers 801a, 801b, 801c, 801e, 801f and 801g in the light-selecting unit 104B and in the light-selecting unit 104R share the same optical thicknesses, and thus these common layers can be manufactured at the same time for both types of the light-selecting units. Consequently, a commonality of the manufacturing processes is achieved, and thus the manufacturing cost can be reduced. In addition, although there is a difference in the optical thicknesses, both the light-selecting unit 104B and the light-selecting unit 104R have an insulator layer. Therefore, the thickness of the light-selecting unit 104B and the thickness of the light-selecting unit 104R can be made equal to each other.

Note that although, in the above embodiment, the pairs (B, Ye) and (R, Cy) are described as examples of pairs of a primary color and a complementary color, any two arbitrary pairs may be selected from among the pairs (B, Ye), (R, Cy) and (G, Mg).

Figure 11:
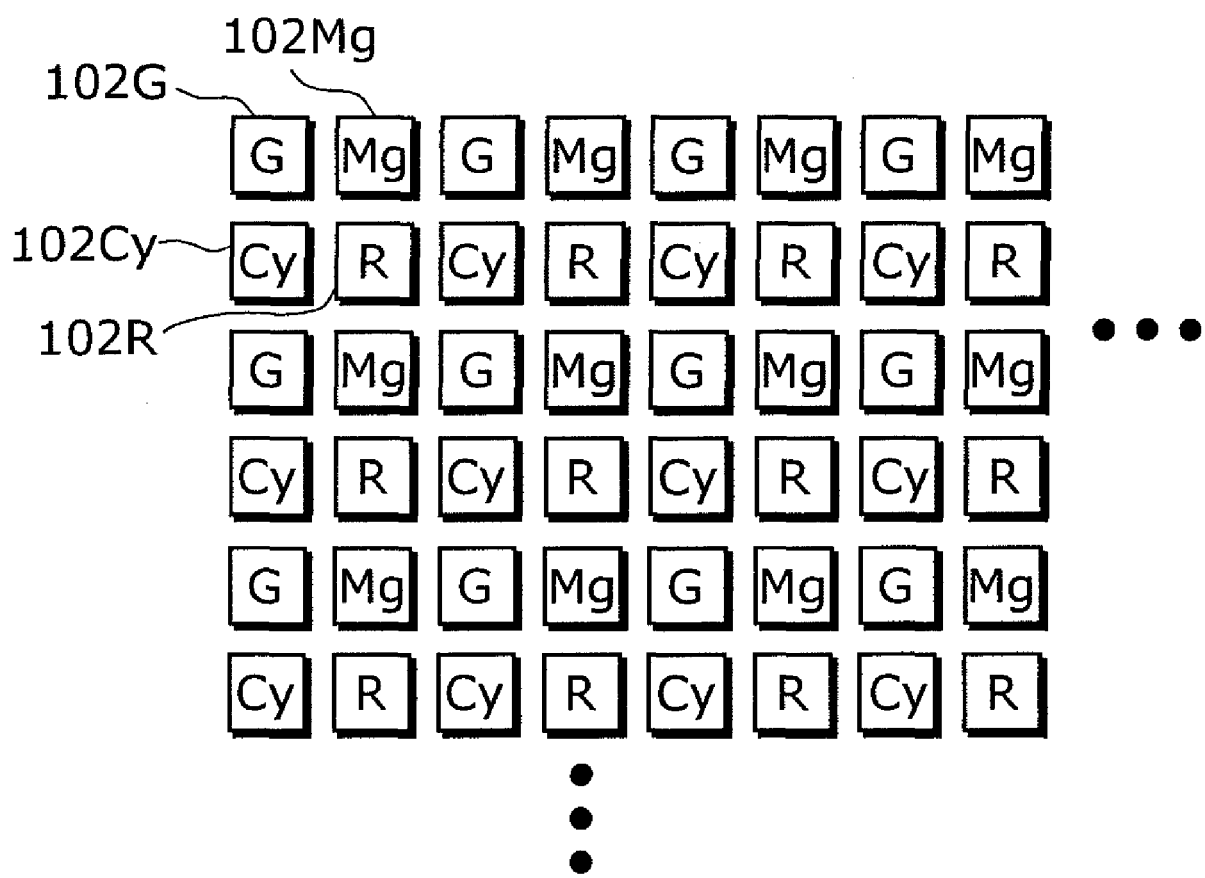
FIG. 11 is a diagram showing a first variation of a color arrangement of photodiodes in the solid-state imaging device.

FIG. 11 is a diagram showing a first variation of a color arrangement of the photodiodes in pairs of a primary color and a complementary color. In this figure, in one of any two rows adjacent to each other, photodiodes 102G and photodiodes 102Mg which correspond to (G, Mg), respectively, are alternately arranged. In the other row of the adjacent rows, the photodiodes 102Cy and the photodiodes 102R which correspond to (Cy, R), respectively, are alternately arranged.

FIG. 12 is a pattern diagram showing an arrangement of the microlenses 109 and cross sections of the rows adjacent to each other in FIG. 11. As shown in a section (a) of FIG. 12, the microlenses 109 are arranged in such manner that the center of each of the microlenses 109 matches the center of a photodiode which corresponds to a primary color, that is, the photodiode 102G and 102R. As shown in sections (b) and (c) of FIG. 12, the light-selecting units 104 and the light-reflecting units 104M in one of any two rows adjacent to each other incline in the opposite direction to the direction in which the light-selecting units 104 and the light-reflecting units 104M in the other row of the adjacent rows incline. Note that in the case where transmission characteristics of the light-selecting units 104R, 104G and 104B are the characteristics shown in the lower part of FIG. 15A, the color arrangement shown in FIG. 11 is the most preferable color arrangement. This is because in FIG. 15A, a width at a half value of blue light is narrower that that of green light and of red light. In other words, by using the light-selecting units 104R and 104G which transmit red light and green light, respectively, and which have a better transmission characteristic than blue light, the sensitivity of the solid-state imaging device can be further enhanced.

Second Embodiment

The present embodiment describes an example of adjusting the optical thickness based on the physical thickness, instead of adjusting the optical thickness based on an insulator layer having the photonic structure in the light-selecting units 104.

Figure 13:
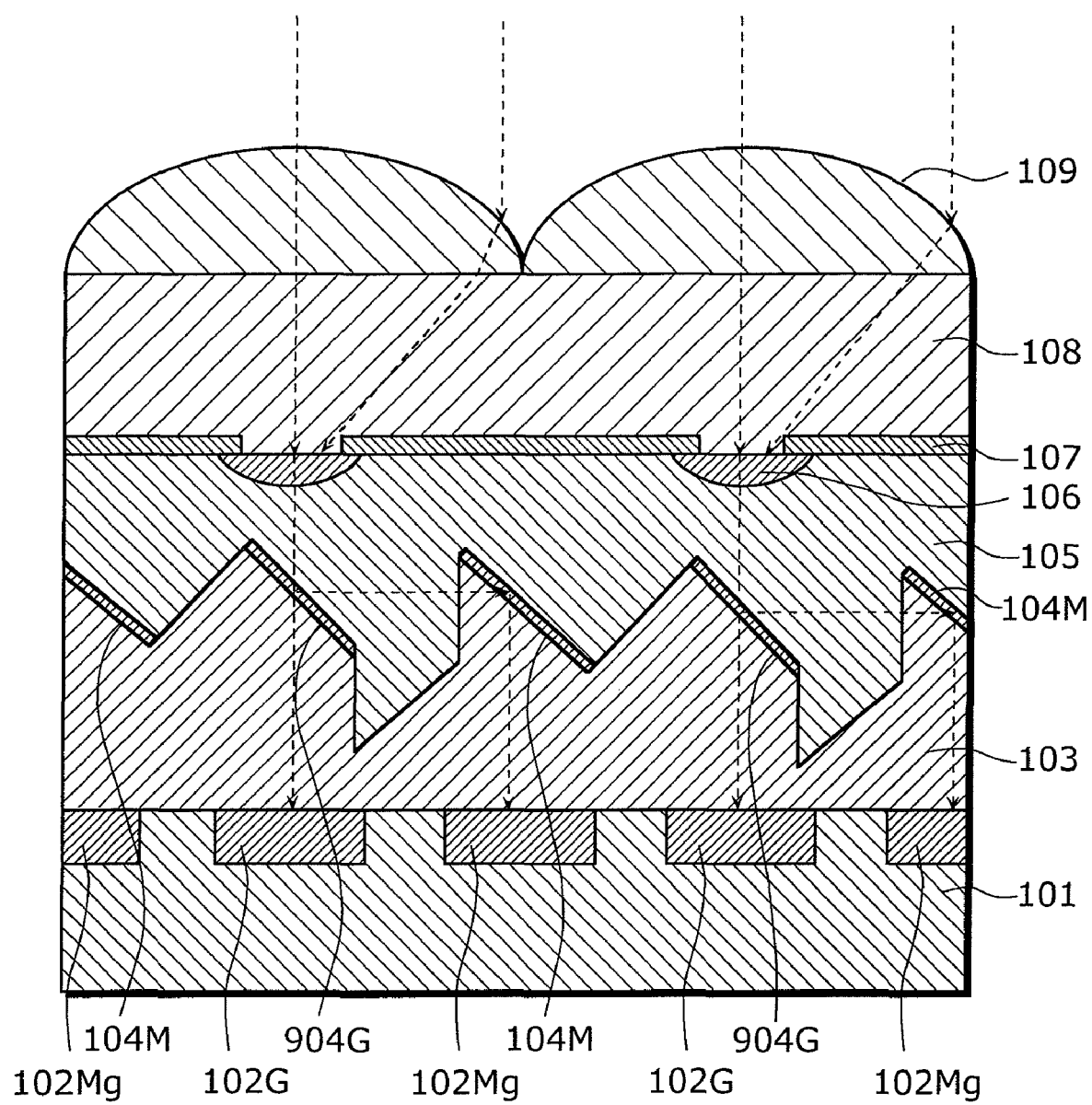
FIG. 13 is a cross-section diagram of a solid-state imaging device of a second embodiment.

FIG. 13 is a cross-section diagram of a solid-state imaging device of the second embodiment. The arrangement of photodiodes shown in FIG. 13 is assumed to be the arrangement shown in FIG. 11 in which the rows of (G, Mg) and the rows of (Cy, R) are alternately arranged.

The cross-section diagram shown in FIG. 13 is different from the cross-section diagram shown in FIG. 5 in that the cross-section diagram of FIG. 13 includes the photodiode 102Mg and the photodiode 102G instead of the photodiode 102Ye and the photodiode 102B, and includes a light-selecting unit 904G instead of the light-selecting unit 104B. Hereinafter, a description on points which are the same in FIG. 5 is omitted, and a description mainly on different points is provided.

The photodiode 102Mg and the photodiode 102G have the same structures as the photodiode 102Ye and the photodiode 102B in a physical sense, however there is a difference in light which enters.

The light-selecting unit 904G is different from the light-selecting unit 104B in that the insulator layer does not have the photonic structure.

Figure 14B:
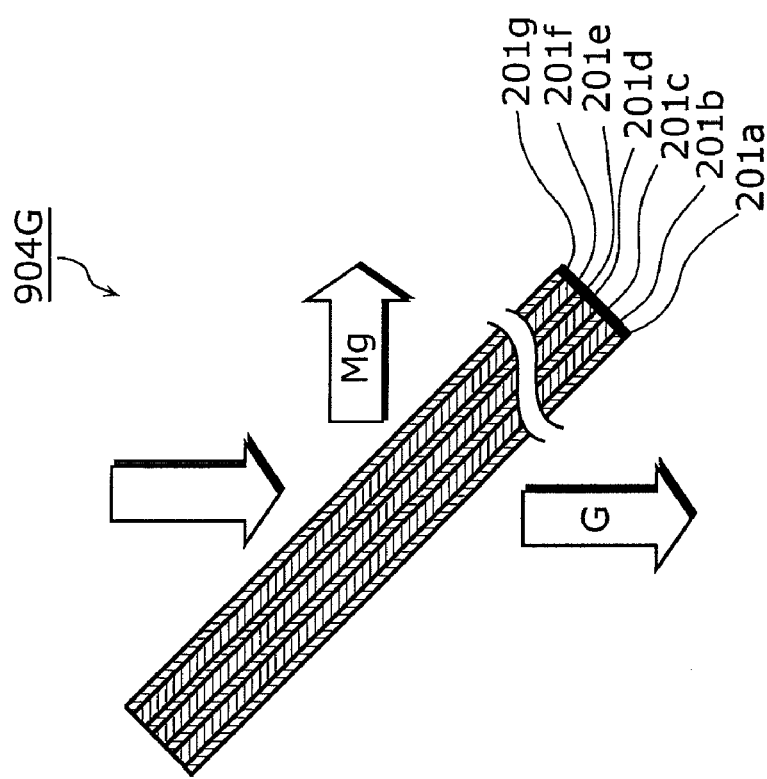
FIG. 14B is a cross-section diagram of a light-selecting unit.
Figure 14A:
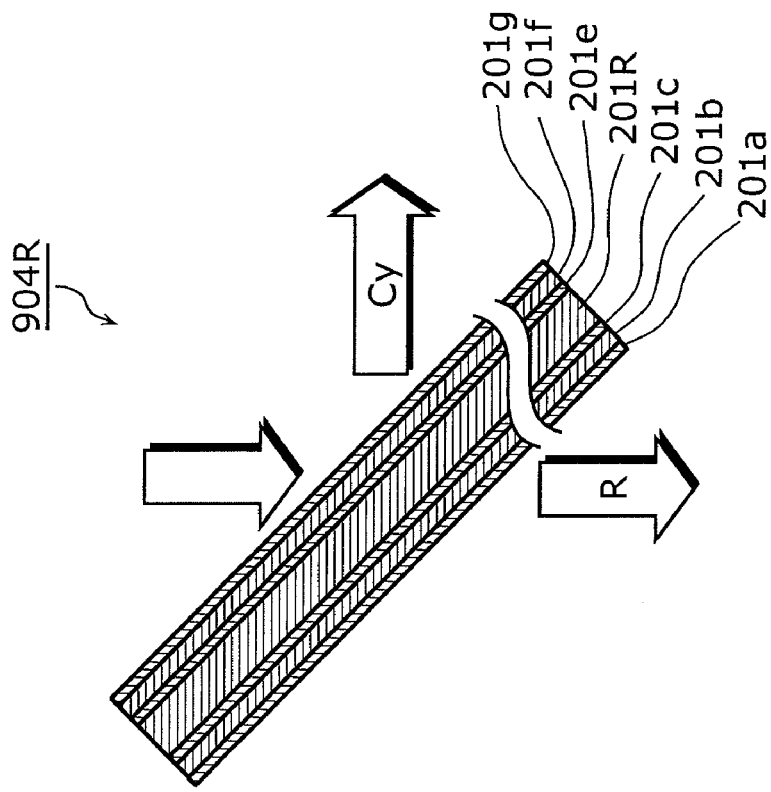
FIG. 14A is a cross-section diagram of a light-selecting unit.

FIG. 14A and FIG. 14B are cross-section diagrams showing more detailed structures of the light-selecting unit 904R and the light-selecting unit 904G, respectively. As FIG. 14A shows, the light-selecting unit 904R is a multilayer film including a titanium dioxide layer 201a, a silicon dioxide layer 201b, a titanium dioxide layer 201c, an insulator layer 201R, a titanium dioxide layer 201e, a silicon dioxide layer 201f, and a titanium dioxide layer 201g. All layers except for the insulator layer 201R have the same optical thicknesses. All layers 201a to 201g except for the insulator layer 201R have the set center wavelength which is the wavelength of green light. The insulator layer 201R shown in FIG. 14A is made of silicon dioxide, and has the optical thickness different from $\lambda/4$, $\lambda$ being the wavelength of green light. Based on the optical thickness of the insulator layer 201R, a wavelength range of light which transmits the light-selecting unit 904R can be adjusted. In other words, by including the insulator layer 201R, the light-selecting unit 904R shown in FIG. 14A shifts the transmission wavelength of the dichroic filter in which each layer has the optical thickness of $\lambda/4$, $\lambda$ being the wavelength of green light. Thus, the light-selecting unit 904R is capable of selectively allowing transmission of light within a desired wavelength range (that is, red light), and reflecting cyan light, the color of which is a complementary color of red.

In contrast, the light-selecting unit 904G shown in FIG. 14B is different from the light-selecting unit 104B in that the light-selecting unit 904G includes a silicon dioxide layer 201d which has the optical thickness of $\lambda/4$. Since the light-selecting unit 904G does not include the insulator layer 201R, it means that the light-selecting unit 904G has the same structure as the dichroic filter in which each layer has the optical thickness of $\lambda/4$, provided that the wavelength of green light is set as the set center wavelength. Therefore, the light-selecting unit 904G allows transmission of light which has the wavelength equal to the set center wavelength $\lambda$ (green light in this case). Accordingly, the light-selecting unit 904G shown in FIG. 14B serves as a dichroic filter and a dichroic mirror which allow transmission of green light, and which reflect magenta light, the color of which is a complementary color of green.

Next, spectral characteristics of the light-selecting units 904 of the present embodiment are described.

Figure 15A:
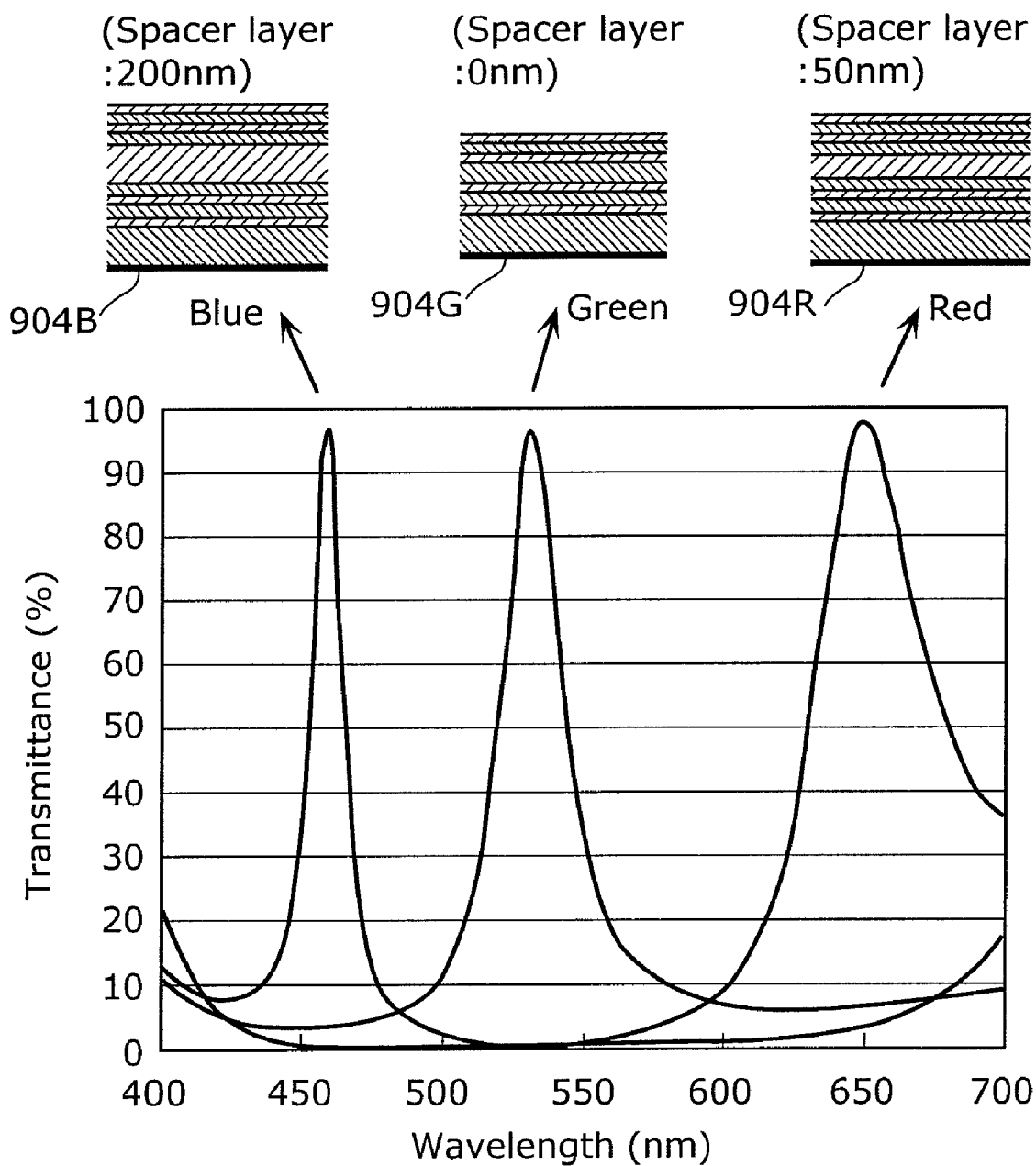
FIG. 15A is a diagram showing the thicknesses of insulator layers and spectral characteristics of light-selecting units.

FIG. 15A is a diagram showing spectral characteristics of the light-selecting units 904B, 904G and 904R. The light-selecting unit 904G shown in the figure is the light-selecting unit 904G shown in FIG. 14B. The thickness of the insulator layer (spacer layer) is 0 nm. The light-selecting unit 904B shown in FIG. 15A has a structure in which an insulator layer (spacer layer) having the thickness of 200 nm is added to the multilayer film of the light-selecting unit 904G shown in FIG. 14B. The light-selecting unit 904R shown in FIG. 15A has a structure in which an insulator layer (spacer layer) having the thickness of 50 nm is added to the multilayer film of the light-selecting unit 904G shown in FIG. 14B.

Note that the spectral characteristics of the light-selecting units 904B, 904G and 904R are derived using a characteristic matrix method. Further, the spectral characteristics are derived with an assumption that the refractive index of titanium dioxide (material having a high refractive index) is 2.5, the refractive index of silicon dioxide (material having a low refractive index) is 1.45, and the optical thickness and physical thickness of the insulator layer (spacer layer) are 200 nm and 80 nm for the light-selecting unit 904B, 50 nm and 20 nm for the light-selecting unit 904R, and 0 nm for the light-selecting unit 904G.

As shown in FIG. 15A, it is possible to change the wavelength of light which transmits the spacer layer by adjusting the thickness of the spacer layer.

Note that instead of the above mentioned titanium dioxide, such material as silicon nitride, tantalum pentoxide, and zirconium dioxide may be used as the material having a high refractive index. Further, a material other than silicon dioxide may be used as the material having a low refractive index.

Next, transmission characteristics of the light-selecting units 904 are described.

Figure 15B:
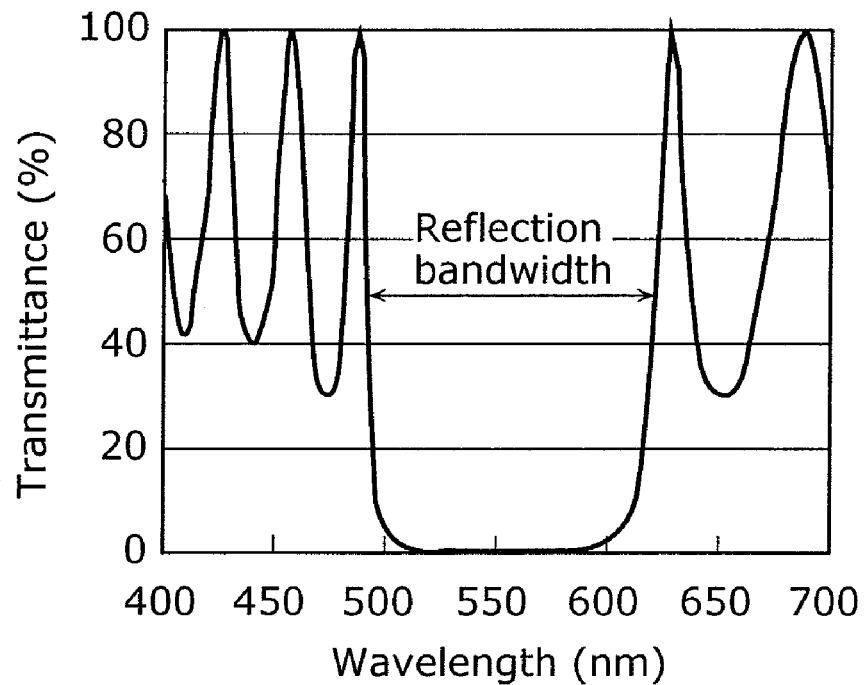
FIGS. 15B and 15C are graphs showing transmission characteristics of a dielectric multilayer film which changes depending on whether or not the spacer layer is included in the film.
Figure 15C:
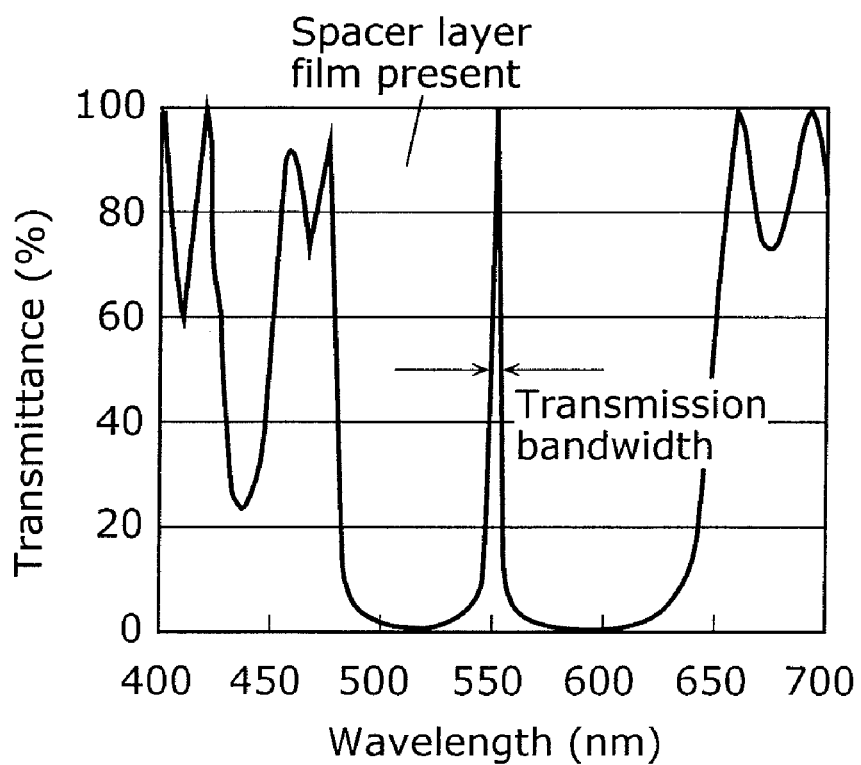

FIGS. 15B and 15C are graphs showing a transmission characteristic of a dielectric multilayer film which changes depending on whether or not a spacer layer is included in the film. Note that the transmission characteristics shown in FIGS. 15B and 15C are derived using a matrix method in which a Fresnel coefficient is used, and are the transmission characteristics of vertical incident light only which are derived with an assumption that the pair number is 10 and the set center wavelength is 550 nm. The vertical axis of each of the graphs indicates transmittance, and the horizontal axis indicates a wavelength of incident light which enters the dielectric multilayer film.

In the case where the entire dielectric multilayer film which includes silicon nitride and silicon dioxide is a multilayer film having the optical thickness of $\lambda/4$, light having the wavelength within a wavelength range is reflected as FIG. 15B shows, the wavelength range having the set center wavelength as the center of the range. Note that the larger the difference is between the refractive index of a multilayer film material having a high refractive index and the refractive index of a multilayer film material having a low refractive index, the larger the reflection bandwidth expands.

In contrast, in the case where the dielectric multilayer film is formed in such manner that multilayer films having the optical thickness of $\lambda/4$ are provided to sandwich the spacer layer having the optical thickness other than $\lambda/4$ and are symmetric to each other with respect to the spacer layer, it is possible to obtain the light-selecting units 904 which allow transmission of only light that has the wavelength near the set center wavelength in the reflection band of the multilayer film which has the optical thickness of $\lambda/4$, as shown in FIG. 15C.

As described above, a change in the thickness of the spacer layer results in a change in the transmission peak wavelength. In the present embodiment, with a focus on such a characteristic, the dielectric multilayer film is used, and thus, the thicknesses of the light-selecting units 904 can be approximately the wavelength of incident light (approximately 500 nm). Therefore, it is possible to minitualize the solid-state imaging device.

Further, the characteristics shown in FIGS. 15A to 15C also apply to the insulator layer having the photonic structure in the first embodiment. This is because in the case where the insulator layer having the photonic structure is used, instead of adjusting the physical thickness, the refractive index is adjusted based on a pitch and an arrangement of the photonic structure, which results in an adjustment of the optical thickness.

As described above, the light-selecting unit 904R and the light-selecting unit 904G both include the common layers 201a, 201b, 201c, 201e, 201f and 201g. Therefore, a commonality of manufacturing processes between the light-selecting unit 904R and the light-selecting unit 904G can be achieved, and the number of manufacturing man-hours can be reduced.

Note that the International Patent Publication WO 2005/069376 A1 discloses the technique of adjusting the transmission wavelength in such manner that the transmission wavelength is shifted from the set center wavelength, by providing an insulator layer in a dielectric multilayer film in which each layer has the optical thickness of λ/4 and by adjusting the optical thickness of the provided insulator layer. The light-selecting units 904R and 904G can be manufactured based on this publication.

Next, a number of variations are described.

Figure 16:
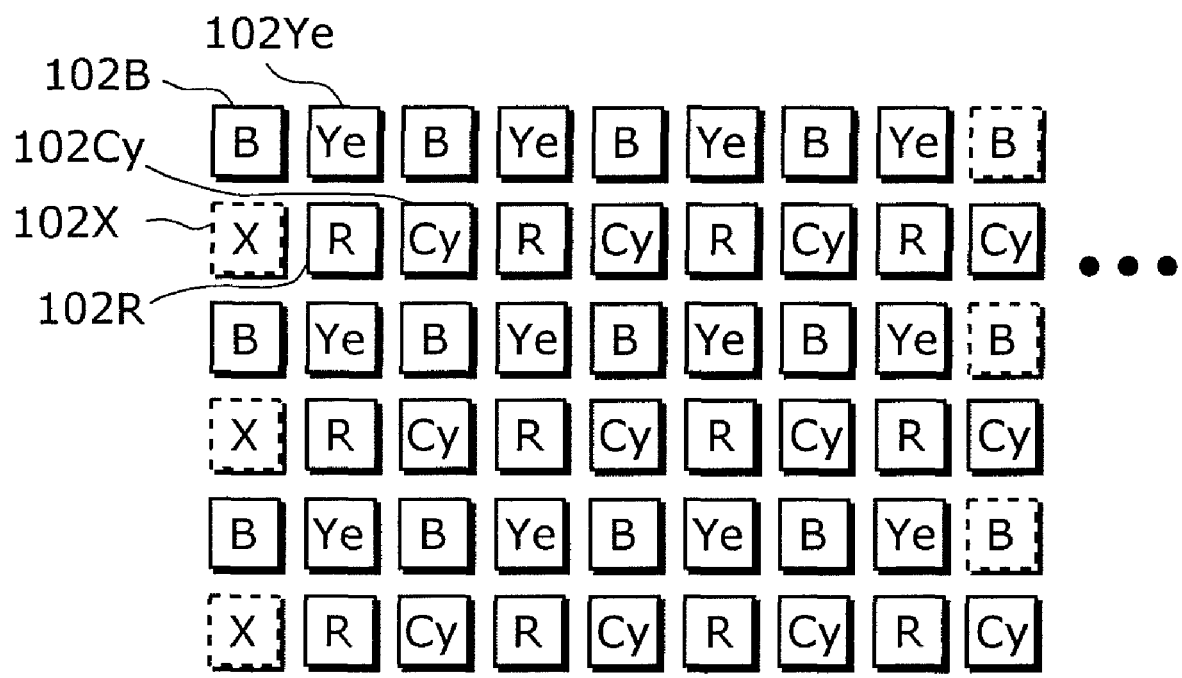
FIG. 16 is a diagram showing a second variation of a color arrangement of photodiodes in the solid-state imaging device.

FIG. 16 is a diagram showing a second variation of a color arrangement of the photodiodes which are in pairs of a primary color and a complementary color. In this figure, in one of any two rows adjacent to each other, the photodiodes 102B and the photodiodes 102Ye, as the pairs (B, Ye), are alternately arranged. In the other row of the adjacent rows, the photodiodes 102R and the photodiodes 102Cy, as the pairs (R, Cy), are alternately arranged. The position of the pair of the photodiodes in one of any two rows which are adjacent to each other is shifted from the position of the pair of the photodiodes in the other row of the adjacent rows by one photodiode (by one pixel). Thus, a photodiode 102X which is at the head of each (R, Cy) row (shown as X in the figure) is not used.

Figure 17:
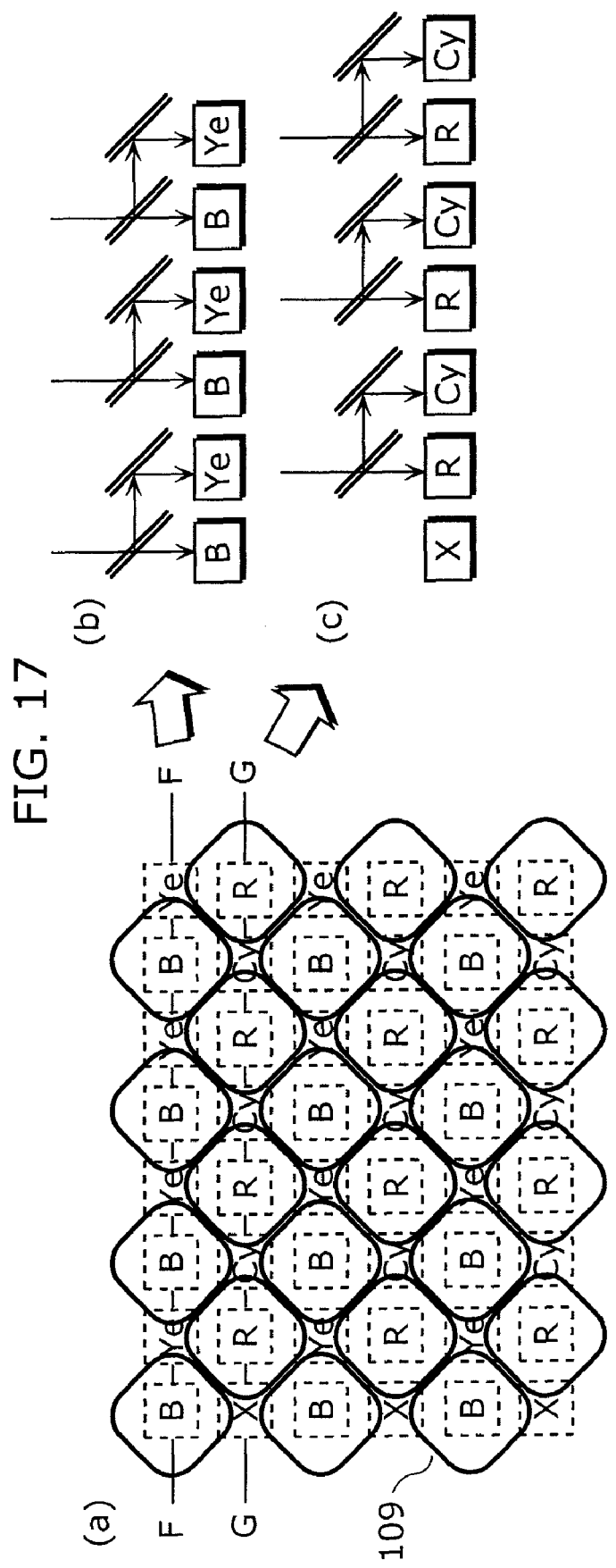
FIG. 17 is a pattern diagram showing cross sections of rows which are adjacent to each other.

FIG. 17 is a pattern diagram, corresponding to FIG. 16, showing an arrangement of the microlenses 109, and cross sections of rows adjacent to each other. As shown in a section (a) of FIG. 17, the shape of each of the microlenses 109 is a rounded rhombic shape (square). The microlenses 109 are arranged in such manner that the center of each of the microlenses 109 matches the center of a photodiode which corresponds to a primary color, that is, the photodiode 102B and 102R. As shown in FIG. 16, shifting the position of the pair of the photodiodes in one of any two rows adjacent to each other from the position of the pair of photodiodes in the other row of the adjacent rows by one pixel (by one photodiode) allows both the light-selecting units 104 and the light-reflecting units 104M in any two rows adjacent to each other to incline in the same direction, as shown in sections (b) and (c) of FIG. 17. Therefore, it is possible to enhance manufacturing reliability.

Figure 18:
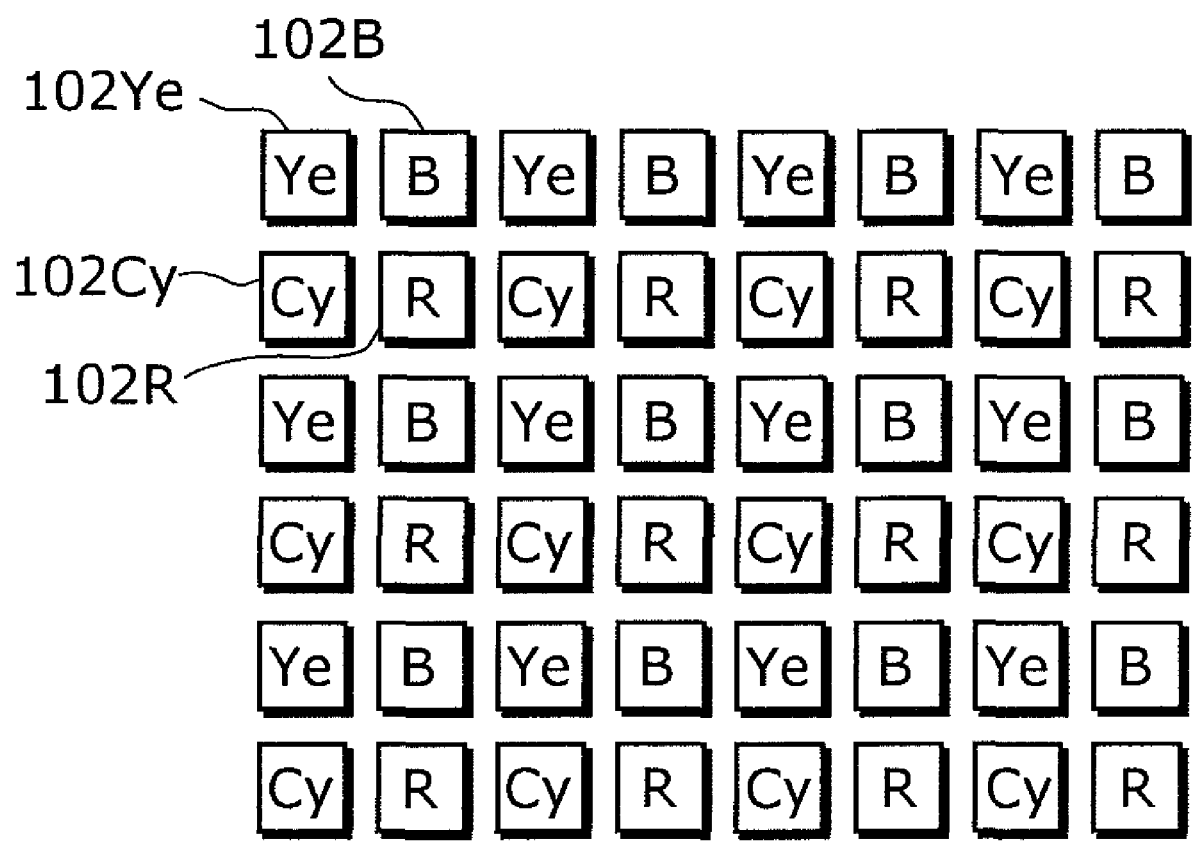
FIG. 18 is a diagram showing a third variation of a color arrangement of photodiodes in the solid-state imaging device.

FIG. 18 is a diagram showing a third variation of the color arrangement of the photodiodes in the solid-state imaging device. In the figure, the photodiode which corresponds to a primary color and the photodiode which corresponds to another primary color are positioned in the same columns. In one of any two rows adjacent to each other, the photodiodes 102Ye and the photodiodes 102B, as the pairs (Ye, B), are alternately arranged. In the other row of the adjacent rows, the photodiodes 102Cy and the photodiodes 102R, as the pairs (Cy, R), are alternately arranged.

Figure 19:
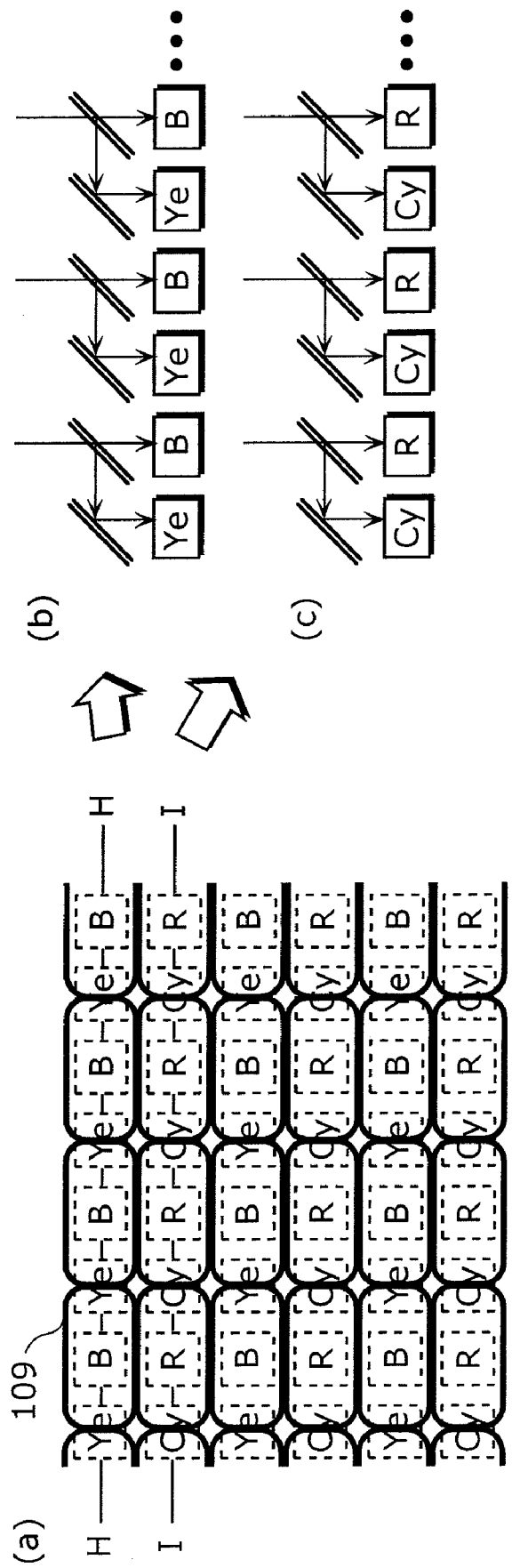
FIG. 19 is a pattern diagram showing cross sections of rows which are adjacent to each other in the third variation.

FIG. 19 is a pattern diagram, corresponding to FIG. 18, showing an arrangement of the microlenses 109, and cross-sections of rows adjacent to each other. As shown in a section (a) of FIG. 19, the shape of each of the microlenses 109 is almost a rectangular. The microlenses 109 are arranged in such manner that the center of each of the microlenses 109 matches the center of a photodiode which corresponds to a primary color, that is, a photodiode 102B and 102R. As shown in FIG. 18, placing the photodiodes which, among the photodiodes in pairs, correspond to primary colors in the same columns allows both the light-selecting units 104 and the light-reflecting units 104M in any two rows adjacent to each other to incline in the same direction as shown in sections (b) and (c) of FIG. 19. Therefore, it becomes easy to uniform inclination degrees of all light-selecting units 104 and all light-reflecting units 104M. The arrangement of the microlenses 109 shown in FIG. 19 enables an increase in the resolution in a specific direction with respect to incident light. More specifically, with the solid-state imaging device of the present embodiment, the vertical arrangement pitch and the horizontal arrangement pitch of the microlenses 109 differ from each other. The vertical arrangement pitch is ½ of the horizontal arrangement pitch. As a result, this structure allows the vertical resolution to be twice the horizontal resolution.

Figure 20:
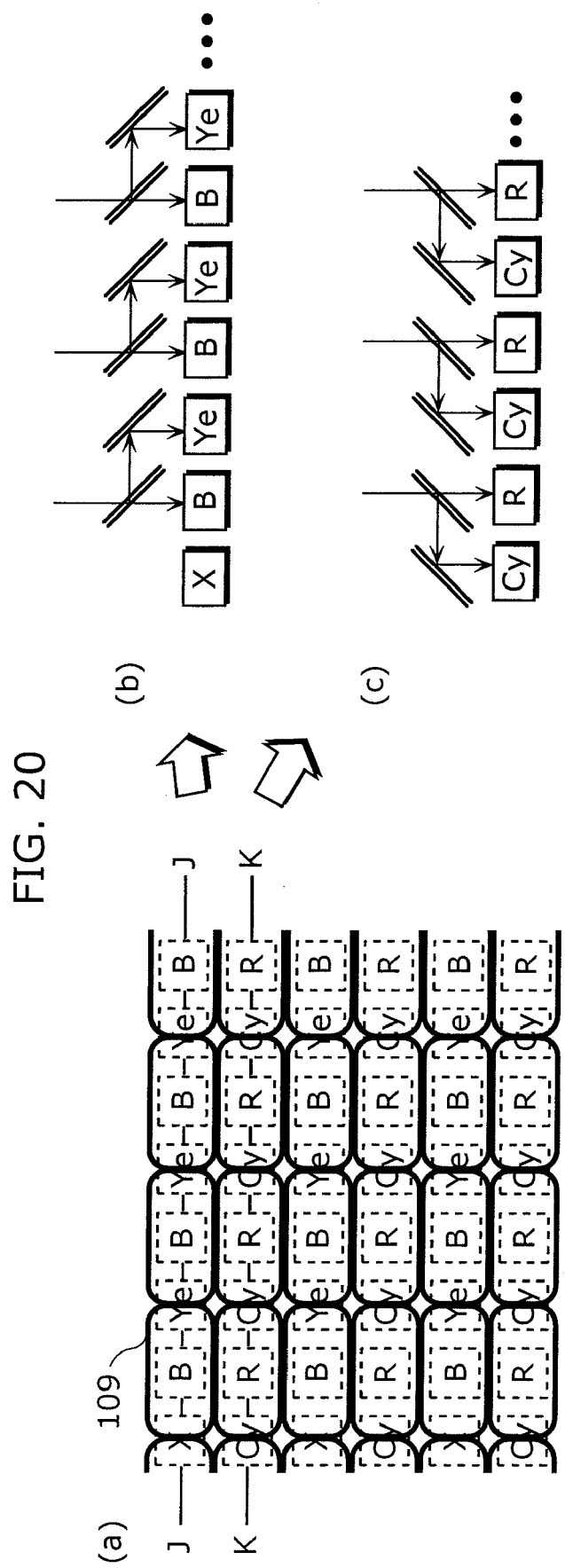
FIG. 20 is a pattern diagram showing cross sections of rows which are adjacent to each other in a fourth variation.

FIG. 20 is a pattern diagram showing a fourth variation of an arrangement of the microlenses 109 and cross-sections of rows adjacent to each other. This figure corresponds to the color arrangement of the photodiodes shown in FIG. 18, however, as shown in sections (b) and (c) of FIG. 20, the position of the pair of the photodiodes in one of any two rows adjacent to each other is shifted from the position of the pair of the photodiodes in the other row of the adjacent rows by one photodiode. In other words, the photodiodes 102X are not used. With this arrangement, the light-selecting unit 104 and the light-reflecting unit 104M in one of any two rows adjacent to each other incline in the opposite direction to the direction in which the light-selecting unit 104 and the light-reflecting unit 104M in the other row of the adjacent rows incline.

Figure 21:
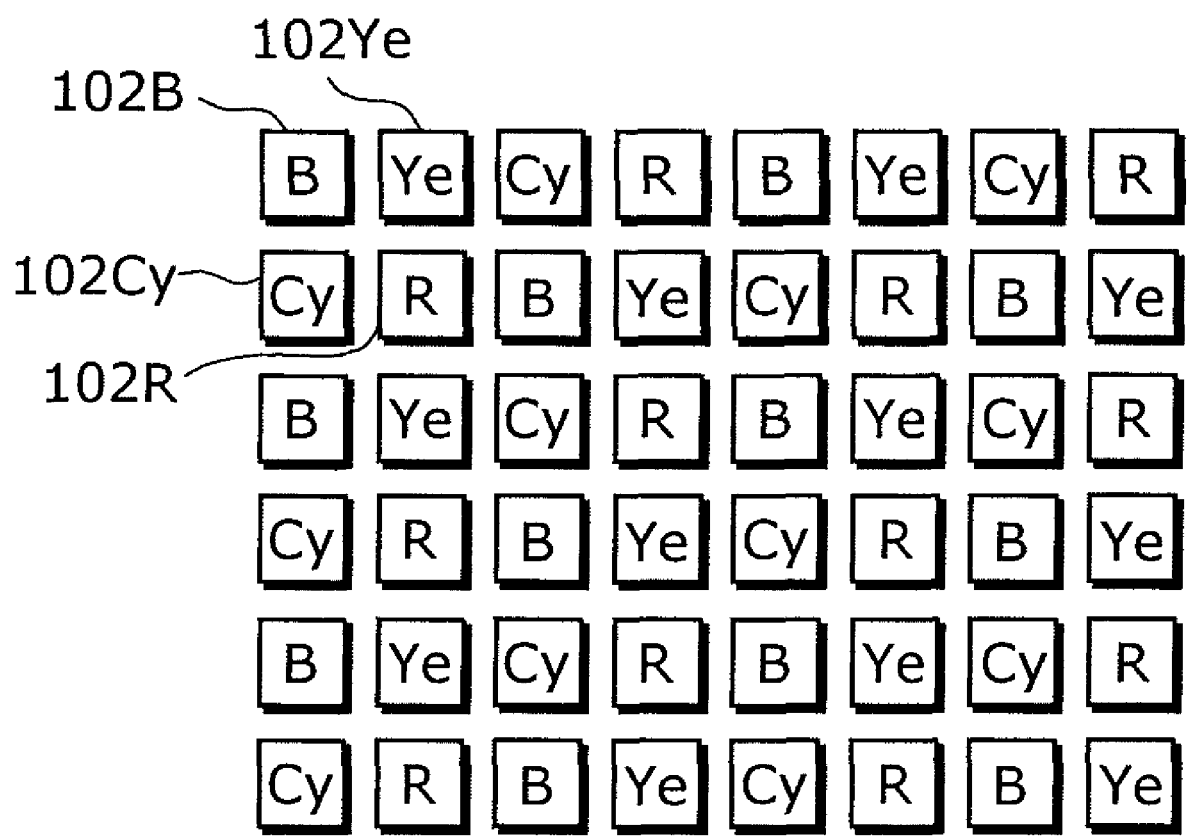
FIG. 21 is a diagram showing a fifth variation of a color arrangement of photodiodes in the solid-state imaging device.

FIG. 21 is a diagram showing a fifth variation of a color arrangement of the photodiodes in pairs of a primary color and a complementary color. In this figure, two types of pairs, that is the pairs (B, Ye) and the pairs (Cy, R) are alternately aligned in each row. In any two rows adjacent to each other, different pairs are vertically adjacent to each other.

Figure 22:
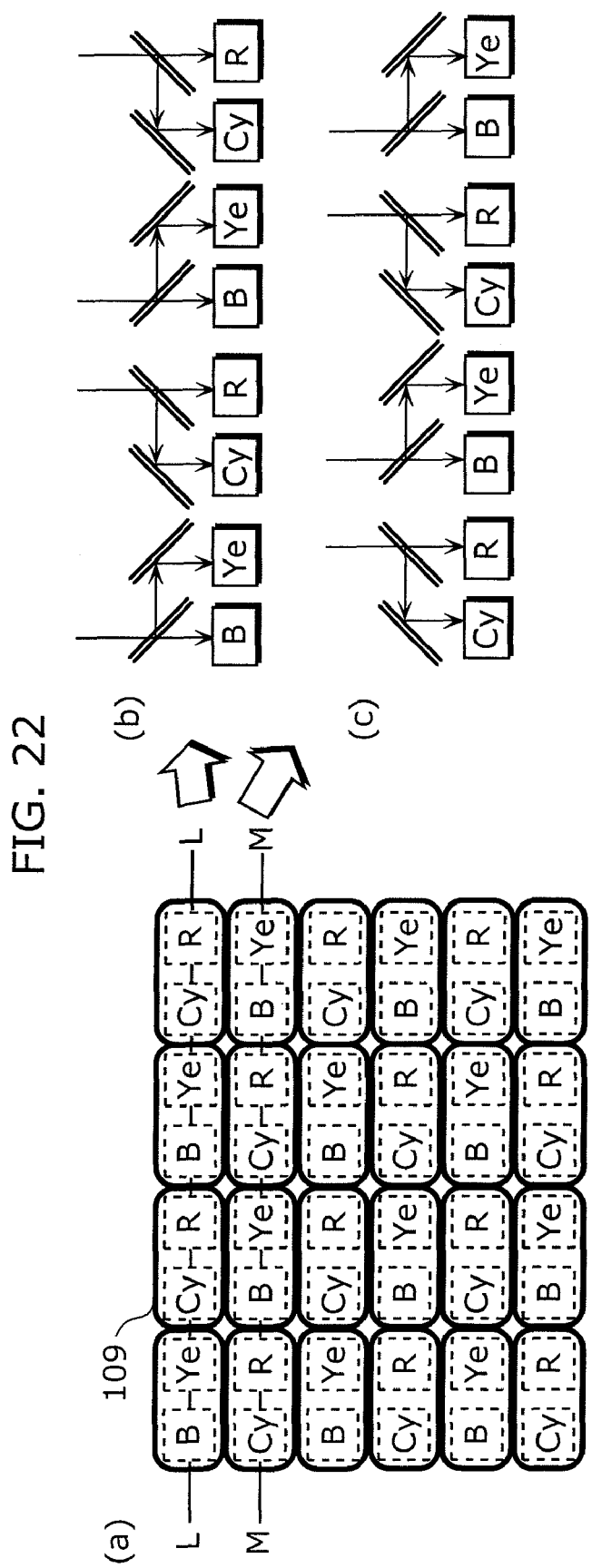
FIG. 22 is a pattern diagram showing cross sections of rows which are adjacent to each other in the fifth variation.

FIG. 22 is a pattern diagram, corresponding to FIG. 21, showing an arrangement of the microlenses 109 and cross-sections of rows adjacent to each other. As shown in a section (a) of FIG. 22, the center of each of the microlenses 109 does not match the center of the photodiode 102 which corresponds to a primary color nor the center of the photodiode 102 which corresponds to a complementary color. The microlenses 109 need to be formed in such manner that each of the microlenses 109 condenses incident light in a direction towards the photodiode 102 which corresponds to a primary color or the photodiode 102 which corresponds to another primary color. As shown in sections (b) and (c) of FIG. 22, the light-selecting unit 104 and light-reflecting unit 104M in one of any two rows adjacent to each other incline in the opposite direction to the direction in which the light-selecting unit 104 and the light-reflecting unit 104M in the other row of the adjacent rows incline.

Figure 23:
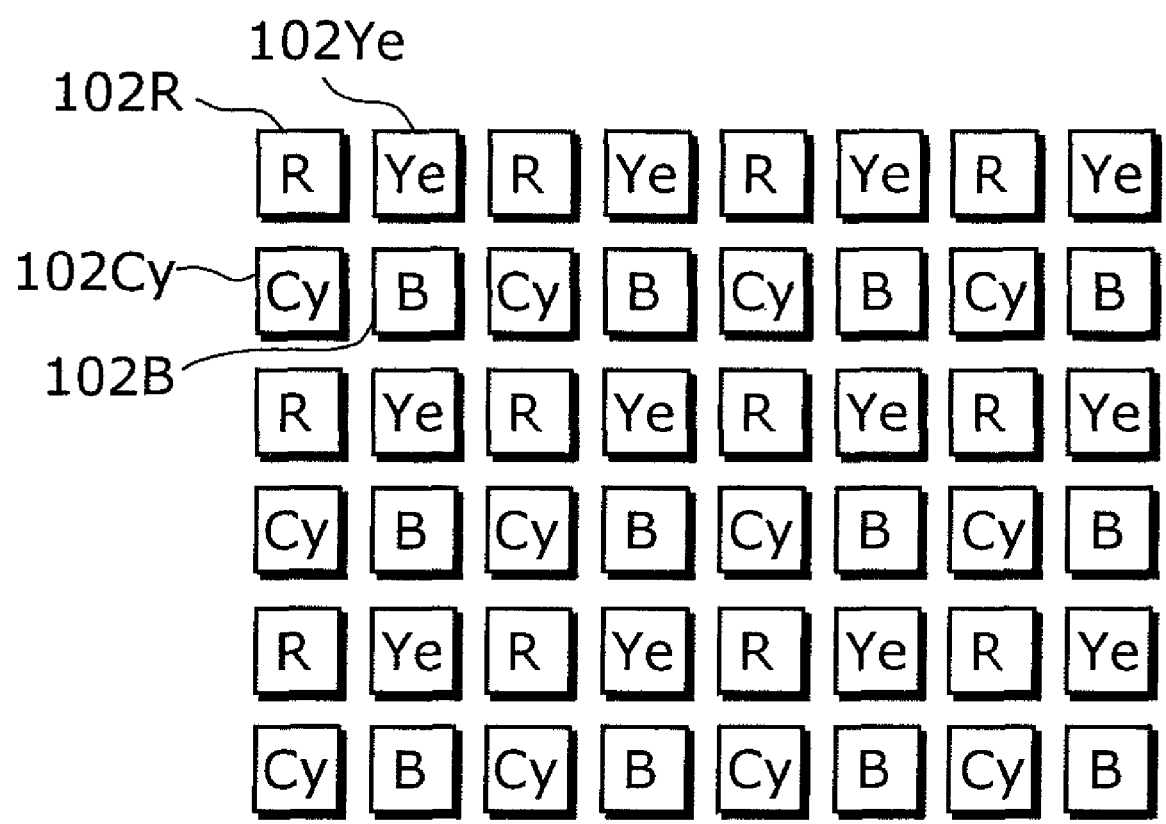
FIG. 23 is a diagram showing a sixth variation of a color arrangement of photodiodes in the solid-state imaging device.

FIG. 23 is a diagram showing a sixth variation of a color arrangement of the photodiodes in pairs of a primary color and a complementary color. In this figure, in one of any two columns adjacent to each other, pairs (R, Cy) are aligned, and in the other column of the adjacent columns, pairs (Ye, B) are aligned.

FIG. 24 is a pattern diagram, corresponding to FIG. 23, showing an arrangement of the microlenses 109, and cross-sections of rows adjacent to each other. As shown in a section (a) of FIG. 24, the center of each of the microlenses 109 matches the center of the photodiode 102 which correspond to a primary color. A section (b) of FIG. 24 is a pattern diagram showing a vertical cross section taken along the line O-O. A section (c) of FIG. 24 is a pattern diagram showing a vertical cross section taken along the line P-P. As shown in the figure, each pair may be a pair of two photodiodes which are vertically adjacent to each other. Further, when the photodiodes having almost rectangular microlenses 109 as shown in FIG. 19, are rearranged in such way that the photodiodes in pairs are vertically aligned rather than horizontally aligned, the microlenses 109 are also rearranged in such way that the long sides of the rectangles are vertically aligned. As a result, this arrangement allows the horizontal resolution to be twice the vertical resolution.

Note that in each embodiment described above, the light-selecting unit 104 selectively allows transmission of primary color light and reflects complementary color light. However, the light-selecting unit 104 may selectively allow transmission of the complementary color light and reflect the primary color light. In such case, the microlenses 109 may be arranged in such manner that the center of each of the microlenses 109 matches the center of the photodiode 102 which corresponds to a complementary color. Further, the microlenses 109 may be arranged in such manner that each of the microlenses 109 in one of any two rows adjacent to each other matches the photodiode 102 which corresponds to a primary color, and the center of each of the microlenses 109 in the other row of the adjacent rows matches the photodiode 102 which corresponds to a complementary color.

Third Embodiment

The present embodiment describes signal processing for converting color signals which are obtained by the solid-state imaging device of each of the above described embodiments into signals of three primary colors.

Figure 25:
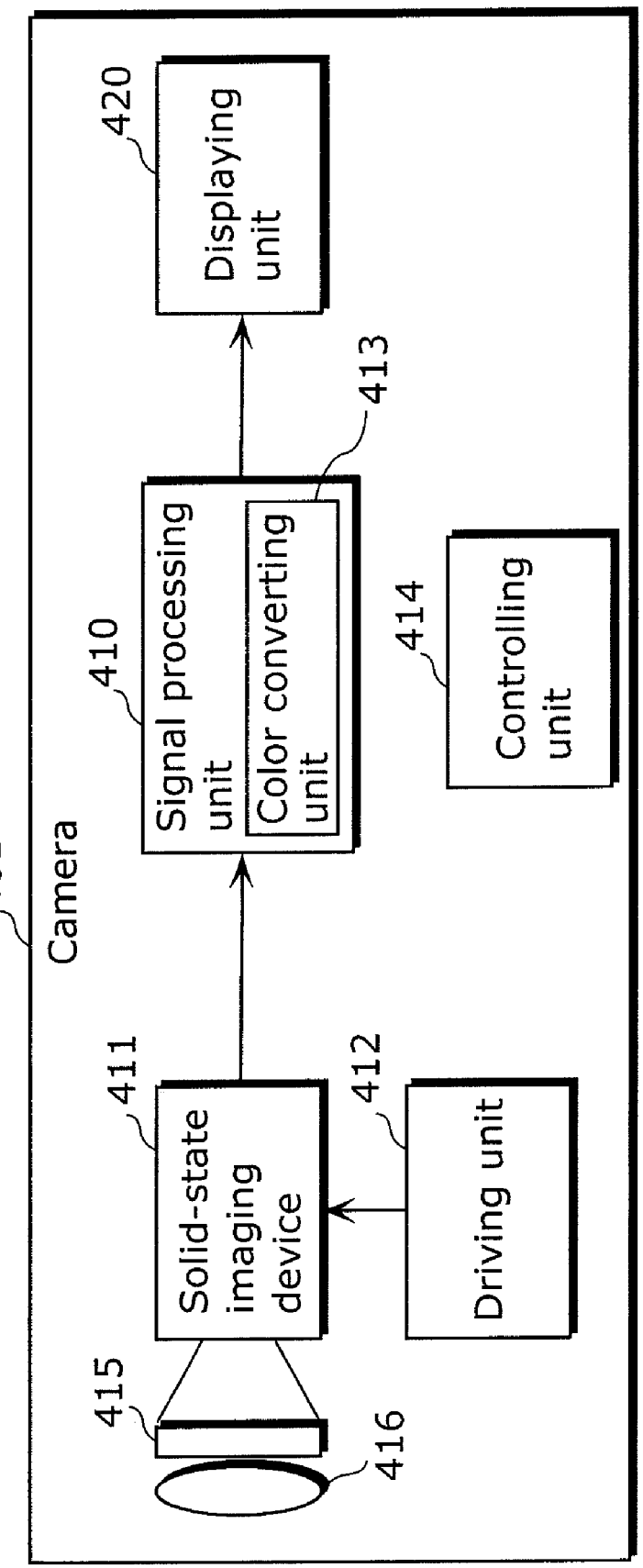
FIG. 25 is a block diagram showing a structure of a camera in a third embodiment.

FIG. 25 is a block diagram showing configuration of a camera according to the third embodiment. As the figure shows, a camera 401 of the present embodiment includes a signal processing unit 410, a solid-state imaging device 411, a driving unit 412, a controlling unit 414, a mechanical shutter 415, a lens 416 and a displaying unit 420.

The signal processing unit 410 includes a color converting unit 413, and performs color conversion by obtaining signals of each of the photodiodes outputted by the solid-state imaging device 411.

The solid-state imaging device 411 is the solid-state imaging device of the above described first and second embodiments. Light from an imaging subject enters the solid-state imaging device via the lens 416 and the mechanical shutter 415. As an imaging result, the solid-state imaging device 411 outputs, in sequence, signals respectively indicating the first primary color, the first complementary color, the second primary color, and the second complementary color obtained from four photodiodes to the signal processing unit 410. A pair of the first primary color signal and the first complementary color signal represents one of the following pairs: (B signal, Ye signal), (R signal, Cy signal) and (G signal, Mg signal). A pair of the second primary color signal and the second complementary color signal represents one of the other pairs mentioned above.

The driving unit 412 outputs various driving signals for driving the solid-state imaging device 411.

The controlling unit 414 controls the entire camera 401.

The displaying unit 420 makes a display on a monitor and a display of a captured image.

Figure 26:
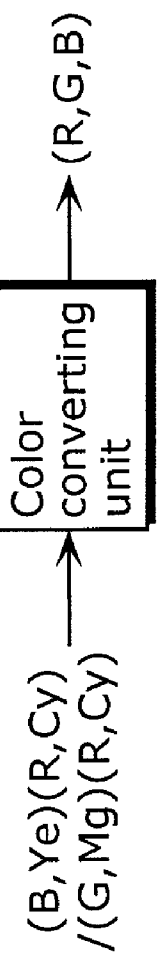
FIG. 26 is an explanatory diagram of a color converting unit.

FIG. 26 is an explanatory diagram of the color converting unit 413. The color converting unit 413 converts the first primary color signal, the first complementary color signal, the second primary color signal and the second complementary color signal into a red signal, a green signal, and a blue signal. This color conversion can be performed using a well-known operation.

Note that for the mechanical shutter 415, a filter may be provided to serve as a removing unit which removes ultraviolet light and infrared light.

Further, in each of the above described embodiments, the solid-state imaging device may be a Charge Coupled Device (CCD) type solid-state imaging device or a Metal Oxide Semiconductor (MOS) type solid-state imaging device.

Furthermore, as a material having a high refractive index, such material as silicon nitride, tantalum pentoxide, and zirconium dioxide may be used instead of using the above described titanium dioxide. Further, as a material having a low refractive index, a material other than silicon dioxide may be used.

Note that the number of layers in the multilayer film of the light-selecting units is not limited to the number shown in the above described embodiments, and may be any number. It is needless to say that a material of each layer is not limited to the above mentioned titanium dioxide, silicon dioxide, and magnesium oxide. Instead, tantalum oxide ($Ta_2O_5$), zirconium oxide ($ZrO_2$), silicon nitride (SiN), silicon nitride ($Si_3N_5$), aluminium oxide ($Al_2O_3$), magnesium fluoride ($MgF_2$) and hafnium oxide ($HfO_3$) may be used.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a solid-state imaging device having photodiodes which are formed on a semiconductor substrate, and to a camera having such a solid-state imaging device. For example, the present invention is applicable to a CCD image sensor, a MOS image sensor, a digital still camera, a camera equipped mobile phone, a monitoring camera, a camera built in a laptop computer, a camera unit connected to an information processing apparatus and the like.

What is claimed is:

1. A solid-state imaging device comprising:
photodiodes which are two-dimensionally arranged;
light condensers each of which condenses light and is positioned to correspond to two of said photodiodes which are adjacent to each other; and
light separators each of which is operable to separate the light entering through said light condensers into first light having a wavelength within a predetermined range, and second light having a wavelength out of the predetermined range, each light separator positioned to correspond to one of said light condensers,
wherein each of said light separators includes:
a light selector operable to selectively allow transmission of one of the first light and the second light and reflect the other one of the first light and the second light, and to allow the transmitted light to enter one of the corresponding two of said photodiodes; and
a light reflector operable to reflect the light, reflected by said light selector, towards the other one of the corresponding two of said photodiodes,
wherein said light separators include first type light separators and second type light separators, wherein the first light separated by said first type light separators is first primary color light indicating a first primary color, among red, green and blue, and the second light separated by said first type light separators is a first complementary color light indicating a color which is complementary to the first primary color, and wherein the first light separated by said second type light separators is second primary color light indicating a second primary color which is different from the first primary color, and the second light separated by said second type light separators is a second complementary color light indicating a color which is complementary to the second primary color.

2. The solid-state imaging device according to claim 1, wherein said light reflector is operable to reflect only visible light.

3. The solid-state imaging device according to claim 1, further comprising a light remover operable to remove infrared light, wherein each of said light separators is operable to separate light from which the infrared light is removed by said light remover, into the first light and the second light.

4. The solid-state imaging device according to claim 1, wherein the first primary color light, the first complementary color light, the second primary color light, and the second complementary color light are red light, cyan light, blue light and yellow light, respectively, said first type light separators are arranged in the same rows or columns, and said second type light separators are arranged in the same rows or columns.

5. The solid-state imaging device according to claim 1, wherein the first primary color light, the first complementary color light, the second primary color light, and the second complementary color light are red light, cyan light, green light and magenta light, respectively, said first type light separators are arranged in the same rows or columns, and said second type light separators are arranged in the same rows or columns.

6. The solid-state imaging device according to claim 1, further comprising a color converter operable to convert signals respectively indicating the first primary color, the first complementary color, the second primary color, and the second complementary color, obtained from said photodiodes, into a red color signal, a green color signal and a blue color signal.

7. The solid-state imaging device according to claim 1, wherein said light selector and one of the corresponding two of said photodiodes are arranged along an optical axis of the light condensed by the corresponding one of said light condensers.

8. The solid-state imaging device according to claim 7, wherein said light condensers are arranged in such manner that the respective centers of said light condensers in a row are shifted from the respective centers of said light condensers in a vertically adjacent row by a distance between the respective centers of two of said photodiodes which are horizontally adjacent.

9. The solid-state imaging device according to claim 1, wherein a vertical arrangement pitch and a horizontal arrangement pitch of said light condensers differ from each other.

10. The solid-state imaging device according to claim 1, wherein said light selector is a multilayer film which includes two types of optical films having different refractive indices, the optical thickness of each of said optical films is equal to a quarter of a set center wavelength, and the multilayer film further includes an insulator layer having a photonic structure which is structured based on the set center wavelength.

11. The solid-state imaging device according to claim 10, wherein said light reflector is operable to reflect only visible light.

12. The solid-state imaging device according to claim 10 further comprising a light remover operable to remove infrared light, wherein each of said light separators is operable to separate light in which the infrared light is removed by said light remover into the first light and the second light.

13. The solid-state imaging device according to claim 1, wherein said light selector is a multilayer film which includes two types of optical films having different refractive indices, the optical thickness of each of said optical films is equal to a quarter of a set center wavelength, and the multilayer film further includes an insulator layer having an optical thickness different than a quarter of the set center wavelength.

14. The solid-state imaging device according to claim 13, wherein said light reflector is operable to reflect only visible light.

15. The solid-state imaging device according to claim 13, further comprising a light remover operable to remove infrared light, wherein each of said light separators is operable to separate light in which the infrared light is removed by said light remover into the first light and the second light.

16. A camera comprising a solid-state imaging device, wherein said solid-state imaging device includes:

photodiodes which are two-dimensionally arranged;

light condensers each of which condenses light and is positioned to correspond to two of said photodiodes which are adjacent to each other; and light separators each of which is operable to separate the light entering through said light condensers into first light having a wavelength within a predetermined range, and second light having a wavelength out of the predetermined range, each light separator positioned to correspond to one of said light condensers, wherein each of said light separators has:

a light selector operable to selectively allow transmission of one of the first light and the second light and reflect the other one of the first light and the second light, and to allow the transmitted light to enter one of the corresponding two of said photodiodes; and a light reflector operable to reflect the light, reflected by said light selector, towards the other one of the corresponding two of said photodiodes, wherein said light separators include first type light separators and second type light separators, wherein the first light separated by said first type light separators is first primary color light indicating a first primary color, among red, green and blue, and the second light separated by said first type light separators is a first complementary color light indicating a color which is complementary to the first primary color, and wherein the first light separated by said second type light separators is second primary color light indicating a second primary color which is different from the first primary color, and the second light separated by said second type light separators is a second complementary color light indicating a color which is complementary to the second primary color.

17. A signal processing method for use in a solid-state imaging device,
wherein the solid-state imaging device includes:
photodiodes which are two-dimensionally arranged;
light condensers each of which condenses light and is positioned to correspond to two of the photodiodes which are adjacent to each other; and
light separators each of which is operable to separate the light entering through the light condensers into first light having a wavelength within a predetermined range, and second light having a wavelength out of the predetermined range, each light separator positioned to correspond to one of the light condensers,
wherein each of the light separators has:
a light selector operable to selectively allow transmission of one of the first light and the second light and reflect the other one of the first light and the second light, and to allow the transmitted light to enter one of the corresponding two of the photodiodes; and
a light reflector operable to reflect the light, reflected by the light selector, towards the other one of the corresponding two of the photodiodes, and the light separators have first type light separators and second type light separators,
wherein the first light separated by the first type light separators is first primary color light indicating a first primary color, among red, green and blue, and the second light separated by the first type light separators is a first complementary color light indicating a color which is complementary to the first primary color, and
the first light separated by the second type light separators is second primary color light indicating a second primary color which is different from the first primary color, and the second light separated by the second type light separators is a second complementary color light indicating a color which is complementary to the second primary color,
said signal processing method comprising:
obtaining, from four of said photodiodes to which the first primary color light, the first complementary color light, the second primary color light and the second complementary color light enter by one of the first type light separators and one of the second type light separators, signals respectively indicating the first primary color, the first complementary color, the second primary color, and the second complementary color; and
converting the obtained four signals into a red color signal, a green color signal and a blue color signal.

* * * * *